(12) United States Patent
Koning et al.

(10) Patent No.: US 9,941,093 B2
(45) Date of Patent: Apr. 10, 2018

(54) TARGET PROCESSING UNIT

(71) Applicant: Mapper Lithography IP B.V., Delft (NL)

(72) Inventors: Johan Joost Koning, Hillegom (NL); David Johannes van den Bergen, The Hague (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 45 days.

(21) Appl. No.: 14/992,049

(22) Filed: Jan. 11, 2016

(65) Prior Publication Data

US 2016/0126055 A1 May 5, 2016

Related U.S. Application Data

(63) Continuation of application No. 14/479,648, filed on Sep. 8, 2014, now Pat. No. 9,263,234.

(Continued)

(51) Int. Cl.
*H01J 37/02* (2006.01)
*G03F 7/20* (2006.01)
(Continued)

(52) U.S. Cl.
CPC ............ *H01J 37/023* (2013.01); *B01J 19/12* (2013.01); *G03F 7/708* (2013.01); *G03F 7/709* (2013.01);
(Continued)

(58) Field of Classification Search
CPC .......... H01J 37/023; H01J 37/10; H01J 37/20; H01J 37/3007; H01J 37/3177;
(Continued)

(56) References Cited

U.S. PATENT DOCUMENTS 5,250,808 A 10/1993 Danilatos et al.
6,088,505 A 7/2000 Hobbs
(Continued)

FOREIGN PATENT DOCUMENTS

JP 2005 106166 4/2005
JP 2005 209702 8/2005
(Continued)

*Primary Examiner* — David E Smith
(74) *Attorney, Agent, or Firm* — Hoyng Rock Monegier LLP; David P. Owen

(57) ABSTRACT

The invention relates to a target processing unit (10) comprising a vacuum chamber (30) for accommodating a target to be processed, a projection column (46) within the vacuum chamber for generating a beam and projecting the beam towards the target, and a first conduit arrangement (26,36, 37,60) for connecting the projection column to external equipment (22). The vacuum chamber can comprise a positioning system (114) for supporting the target, and a second conduit arrangement (110) distinct from the first conduit arrangement for connecting the positioning system to external equipment, wherein the positioning system is moveably arranged with respect to the projection column, and wherein the positioning system and the projection column occupy spatially distinct portions of the vacuum chamber. The first conduit arrangement extends through an upper side of the vacuum chamber, and the second conduit arrangement extends through a lower side of the vacuum chamber.

19 Claims, 12 Drawing Sheets

Related U.S. Application Data

(60) Provisional application No. 61/875,016, filed on Sep. 7, 2013.

(51) Int. Cl.
*H01J 37/20* (2006.01)
*H01J 37/30* (2006.01)
*H01J 37/317* (2006.01)
*B01J 19/12* (2006.01)
*H01J 37/10* (2006.01)

(52) U.S. Cl.
CPC ...... *G03F 7/70825* (2013.01); *G03F 7/70833* (2013.01); *G03F 7/70891* (2013.01); *G03F 7/70975* (2013.01); *H01J 37/10* (2013.01); *H01J 37/20* (2013.01); *H01J 37/3007* (2013.01); *H01J 37/3177* (2013.01)

(58) Field of Classification Search
CPC .. G03F 7/708; G03F 7/70825; G03F 7/70833; G03F 7/70891; G03F 7/709; G03F 7/70975; B01J 19/12
See application file for complete search history.

(56) References Cited

U.S. PATENT DOCUMENTS

| | | | |
|---|---|---|---|
| 2001/0050759 A1* | 12/2001 | Kamiya | G03F 7/2002 355/30 |
| 2003/0136923 A1 | 7/2003 | Watson | |
| 2005/0023486 A1 | 2/2005 | Takakuwa et al. | |
| 2006/0060775 A1* | 3/2006 | Sakakibara | B82Y 10/00 250/307 |
| 2009/0261267 A1 | 10/2009 | Wieland et al. | |
| 2011/0084220 A1* | 4/2011 | Koning | H01J 37/12 250/492.3 |
| 2011/0193573 A1 | 8/2011 | De Boer et al. | |
| 2011/0261344 A1 | 10/2011 | De Boer et al. | |
| 2012/0175527 A1* | 7/2012 | De Boer | G03F 7/708 250/453.11 |
| 2012/0320359 A1 | 12/2012 | Van Zwet et al. | |
| 2013/0043413 A1 | 2/2013 | De Boer et al. | |
| 2015/0228447 A1* | 8/2015 | Ominami | H01J 37/16 250/307 |

FOREIGN PATENT DOCUMENTS

| | | |
|---|---|---|
| JP | 2006-013388 | 12/2006 |
| WO | WO 2010 125526 A1 | 11/2010 |
| WO | WO 2011 043668 | 4/2011 |
| WO | WO 2011 080308 | 7/2011 |
| WO | WO 2013 037486 A2 | 3/2013 |
| WO | WO 2013 037802 A1 | 3/2013 |
| WO | WO 2013 037856 A1 | 3/2013 |
| WO | WO 2013 171216 A1 | 11/2013 |

* cited by examiner

TARGET PROCESSING UNIT

CROSS REFERENCE TO RELATED APPLICATIONS

This application is a continuation of U.S. patent application Ser. No. 14/479,648 filed on 8 Sep. 2014, which claims priority from U.S. provisional application No. 61/875,016 filed on 7 Sep. 2013. All abovementioned applications are hereby incorporated by reference in their entireties.

TECHNICAL FIELD

The invention relates generally to a target processing unit. Furthermore, the invention relates to a projection lens assembly for use in a target processing unit. Another aspect relates to an intermediate conduit assembly, to a vacuum chamber of a target processing unit, and to a target processing unit comprising the intermediate conduit assembly.

BACKGROUND ART

It is known in the field of electronics that grouping of electronic device components into functionally integrated modules can help to reduce the time required for defective component replacement, which yields a shorter down time for repair of such a modular device. Modular component design is particularly desirable for electronic devices that are used in production lines, due to the increased production rates that may be achieved as a result of reduced maintenance time.

In charged particle beam processing devices and the like, it is not straightforward to implement the modular principle. The main reason for this is that the various particle beam generation and manipulation stages (e.g. beam source, collimator, beam splitter, beam blanker, beam stopper, beam deflector, and lens elements) cooperate to form and control the beams that traverse each of these stages. A computer designer mainly deals with issues relating to data/signal exchange between the modules, power requirements, electromagnetic compatibility, and thermal management. Applying the modular principle in beam processing devices is substantially more complicated, because in addition to the above, one also needs to take into account beam alignment issues, field calibration, and mechanical (de-)coupling between the modules. Furthermore, as all components work together to manipulate the same particle beams, it is not straightforward to identify the preferred groups of components that should form the modules in such a way as to obtain an optimal balance between high beam alignment accuracy (less separation into modules), and high maintenance efficiency (more modules).

International patent application WO2013/037486 discusses positioning and planar alignment of various projection modules in a carrier frame of a beam exposure system, to form a thermally stabilized aligned projection column from vertically stacked modules.

However, WO2013/037486 does not disclose a detailed configuration for a projection module, and does not provide a solution for connectivity of various conduits that supply and discharge signals and fluids to and from such a projection module (e.g. a projection lens arrangement).

SUMMARY OF THE INVENTION

It would be desirable to provide a projection lens arrangement and a lithography unit or inspection unit for processing a target, which allow efficient modular construction and maintenance of the projection column, while optimizing connectivity of various conduits.

Furthermore, in the semiconductor industry, an ever-increasing desire exists to manufacture smaller structures with high accuracy and reliability. In lithography systems, this desire results in extremely high demands with respect to positioning and orientation. External vibrations caused by other machines in a fab environment and/or electrical circuitry may have a negative influence on the positioning accuracy within the lithographic apparatus. Similarly, vibrations within a lithographic apparatus, for example caused by stage movement, may have a negative influence on such accuracy.

It may generally be desirable to provide a compact arrangement of further equipment (i.e. target processing equipment) and their corresponding cables and conduits inside the vacuum chamber, as well as an arrangement of intermediate cables and conduits needed for connecting further equipment inside the vacuum processing chamber to corresponding equipment inside the control and monitoring cabinet.

The cables and conduits are preferably arranged to contribute to one or more of the following goals:

the modular arrangement of modules/devices and conduits inside each processing unit facilitates separate replacement of such modules/devices and conduits, by forming and positioning modules/devices and corresponding cables in a manner that promotes movability along the longitudinal direction while reducing obstruction of other modules/devices along this direction;

the grouped arrangement of conduits inside a processing unit is sufficiently mechanically separated to promote distinct motional/vibrational decoupling per module/device to the extend needed for that particular module/device; and the grouped arrangement of conduits inside a processing unit supports the modular concept by providing separate conduit paths for modules/devices that belong to the projection optics column and for modules/devices that do not, resulting in a vacuum space for the projection optics column that is occupied by a reduced or even minimal number of conduits belonging to non-column related modules/devices.

It would be desirable to reduce vibrations within a lithography unit as much as possible.

To meet one or several of the above-mentioned goals, according to a first aspect of the invention a target processing unit is proposed comprising a vacuum chamber for accommodating a target to be processed, a projection column within the vacuum chamber for generating a beam and projecting the beam towards the target, a positioning system within the vacuum chamber for supporting the target, wherein the positioning system is moveably arranged with respect to the projection column, and wherein the positioning system and the projection column occupy spatially distinct portions of the vacuum chamber, a first conduit arrangement for connecting the projection column to corresponding equipment external to the vacuum chamber, and a second conduit arrangement distinct from the first conduit arrangement for connecting the positioning system to corresponding equipment external to the vacuum chamber. The first conduit arrangement can extend through an upper side of the vacuum chamber. The second conduit arrangement can extend through a lower side of the vacuum chamber.

According to a second aspect of the invention a target processing unit is proposed comprising a vacuum chamber for accommodating a target to be processed, a vacuum casing arranged for providing a vacuum environment within the vacuum chamber, a projection column within the vacuum chamber for generating a beam and projecting the beam towards the target, a carrier casing within the vacuum casing arranged for supporting the projection column, wherein at least a part of the projection column is moveably arranged with respect to the carrier casing, and a first conduit arrangement for connecting the projection column to corresponding equipment external to the vacuum chamber. The first conduit arrangement can comprises an access port at least partly located outside of the vacuum chamber for detachably connecting the corresponding equipment and a connector panel located inside of the vacuum chamber for detachably connecting one or more parts of the projection column. The access port and the connector panel can be vibration/motion decoupled connected via one or more intermediate conduits of the first conduit arrangement.

According to a third aspect of the invention an intermediate conduit assembly is proposed for use as a first conduit arrangement in a target processing unit. The intermediate conduit assembly can comprise an access port for detachably connecting electronic equipment and a connector panel for detachably connecting one or more parts of a projection column. The access port can be arranged to be at least partly located outside of a vacuum chamber and the connector panel can be arranged to be located inside of the vacuum chamber. The access port and the connector panel can be arranged to be vibration/motion decoupled connected via one or more intermediate conduits when installed in the vacuum chamber.

The target processing unit may for example be formed by a lithography unit. One or more parts of the projection column may include an illumination optics module including a charged particle beam source and a beam collimator array, a condenser lens module including an aperture array and a condenser lens array, a beam switching module including a beamlet blanker array, and/or a projection lens assembly with lens elements. The lens elements of the projection lens assembly may include a beam stop array, a beam deflector array and/or a projection lens array.

The term "projection beam" or "beam" refers herein to a beam of radiation, which may be formed by a stream of charged particles (e.g. electrons or ions) and/or by a beam of optical radiation (e.g. X-rays or UV radiation). The terms "beam" and "beamlet" may be used interchangeably, although the term "beamlet" may imply that the resulting beam has been extracted from a larger main beam (e.g. multi-beamlet extraction from a larger electron beam using a mask plate with a plurality of relatively small apertures).

The term "conduit" is used herein in a broad sense, and covers various kinds of elongate tubular structures that have relatively small cross-sections with respect to their lengths, and that are arranged for conveying matter and/or energy between source devices and destination devices. Exemplary conduits are formed by wires (e.g. single stranded) and cables (e.g. twisted strands, coaxial) comprising electrically conducting material for conveying electrical power and/or control or measurement signals, optical fibers (e.g. for conveying optical control and/or measurement signals), and fluid transport tubes (e.g. for conveying cooling fluids).

As a result of the above, an operator or maintenance mechanic may easily position/remove the projection column or parts thereof using one hand, while using the other hand to attach/remove the distal conduit ends to/from their point of connection. A modular construction is facilitated as well as easy maintenance of a projection column (resulting in minimal down time), while simultaneously allowing transversal dimensions of the projection column as well as vertical distances between projection column components (and hence also vertical dimensions) to be kept minimal.

Furthermore, it should be noted that minimizing the dimensions of the projection column is particularly desirable in lithography or other target processing applications wherein vacuum requirements necessary for processing are severe, and fab space corresponding to the area covered by the processing unit is highly expensive. Typically, vertical space is more easily made available in the processing vacuum chamber of a target processing unit than horizontal space is. Hence, the proposed projection lens assembly with a conduit arrangement that enables the various conduits to be (dis-)connected via a motion along the insertion direction to panel connectors that are vertically arranged along the projection column facilitates maintenance as well as reduces production costs related to fab space.

In an embodiment the vacuum chamber can comprise a vacuum casing that defines a first wall, and a second wall that is opposite to the first wall, wherein the first wall and second wall jointly border a front chamber side with an opening for inserting and removing the projection column into and from the vacuum chamber, wherein the first wall forms the upper side of the vacuum chamber, and wherein the second wall forms the lower side of the vacuum chamber.

In an embodiment the second conduit arrangement is guided along a lateral wall of the vacuum chamber to the lower side of the vacuum chamber.

In an embodiment a second conduit guiding assembly can be provided along the lateral wall of the vacuum chamber extending from the upper side to the lower side thereof for guiding the second conduit arrangement.

In an embodiment the first conduit arrangement can comprise an access port at least partly located outside of the vacuum chamber for detachably connecting the corresponding equipment and a connector panel located inside of the vacuum chamber for detachably connecting one or more parts of the projection column, wherein the access port and the connector panel are vibration/motion decoupled connected via one or more intermediate conduits of the first conduit arrangement.

In an embodiment the intermediate conduits can be configured to provide electric and/or optical signal connection between the access port and the connector panel during operation. The intermediate conduits can be provided with a curved flexible intermediate conduit portion configured to provide the vibration/motion decoupling between the access port and the connector panel.

In an embodiment the vacuum chamber can comprise a vacuum casing arranged for providing a vacuum environment within the vacuum chamber, a support casing within the vacuum casing arranged for supporting a carrier casing, and the carrier casing within the support casing arranged for supporting the projection column. The connector panel can be attached to an inner side of the carrier casing. A second attachment member can be connected to an outer side of the carrier casing, the one or more intermediate conduits emanating from the connector panel and guided to the second attachment member. A first attachment member can be attached to an inner side of the support casing. A first flexible intermediate conduit portion of the one or more intermediate conduits can extend between the first attachment member and the second attachment member The access port can be provided on an outer side of the vacuum casing. A second flexible intermediate conduit portion of the one or more intermediate conduits can extend between the first attachment member and the access port.

In an embodiment the intermediate conduits can emanate from a rear side of the connector panel and can be guided on the inside of the vacuum chamber via a predominantly vertical trajectory to a top side of the vacuum chamber.

In an embodiment at least one of the first intermediate conduit portion and the second intermediate conduit portion can be curved.

In an embodiment the target processing unit can further comprise a cabinet for accommodating the equipment, wherein preferably the cabinet is located on the upper side of the vacuum chamber and is supported by the first wall.

In an embodiment the control panel can comprise one or more complementary connectors for receiving connectors at distal ends of conduits connected to a part of the projection column.

BRIEF DESCRIPTION OF THE DRAWINGS

Embodiments will now be described, by way of example only, with reference to the accompanying schematic drawings in which corresponding reference symbols indicate corresponding parts, and in which:

FIG. 5b shows a detailed rear perspective view of the embodiment in FIG. 5a;

Figure 1:
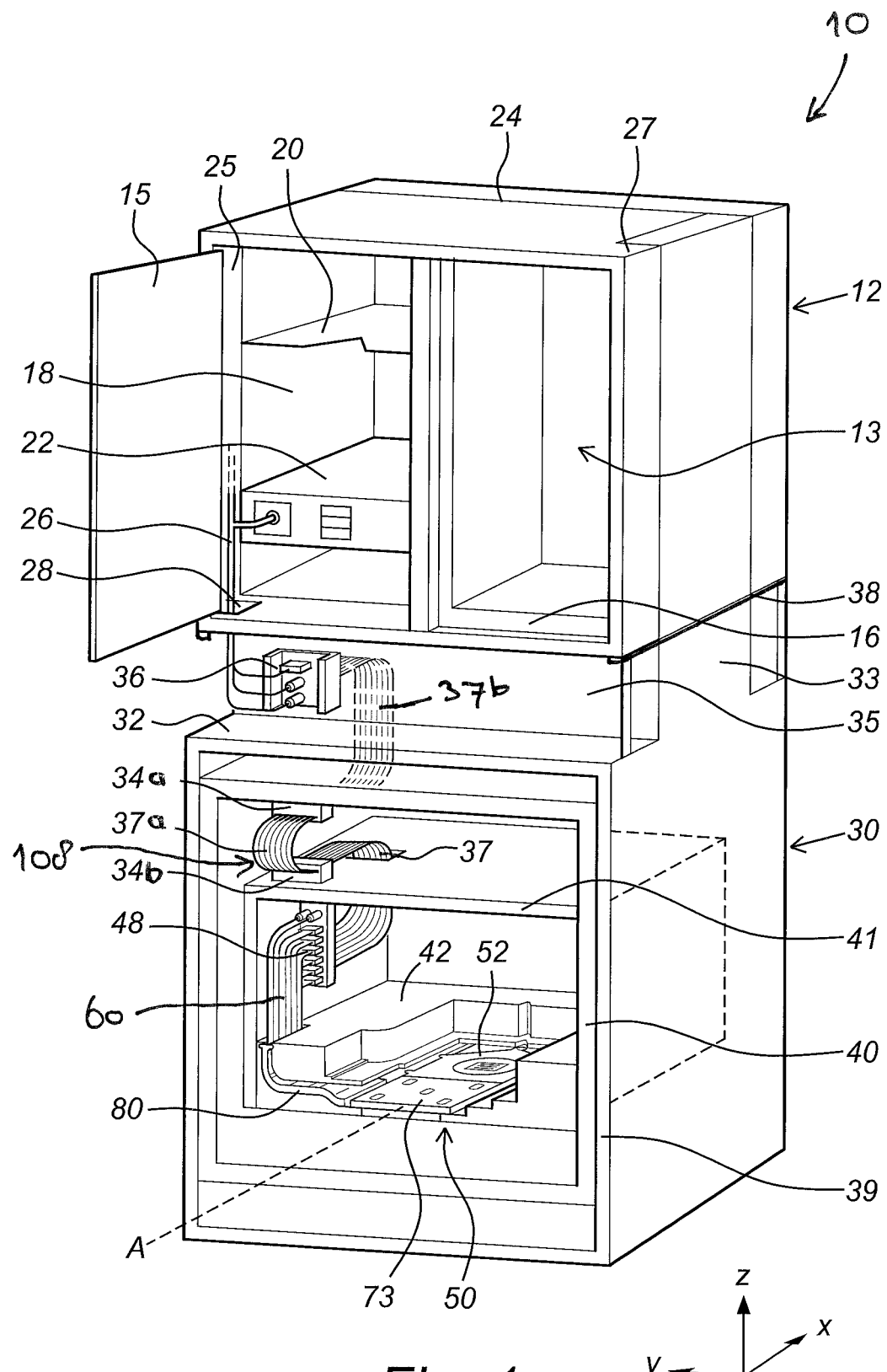
FIG. 1 schematically shows a perspective view of an exemplary embodiment of a target processing unit.

The drawings are meant for illustrative purposes only, and do not serve as restriction of the scope or the protection as laid down by the claims.

DESCRIPTION OF ILLUSTRATIVE EMBODIMENTS

In the drawings, various directions are indicated for defining positions, orientations, and motion of the described objects. In the exemplary embodiments shown in the drawings and described herein, X is used to indicate a longitudinal direction, which in the exemplary embodiments corresponds to the insertion direction for the projection lens arrangement. Prepositions "front" and "rear" pertain to this longitudinal direction X. Further, Y is used to indicate a transversal direction (in the plane spanned by the projection lens element) that is perpendicular to the longitudinal direction X. During use of exemplary lithography units, vacuum chambers and cabinets, the longitudinal direction X and transversal direction Y span a plane that preferably is substantially parallel to the horizontal. The terms "left/right" and "lateral" correspond to the transversal direction Y. Z is used to indicate a perpendicular direction (e.g. vertical direction) that is orthogonal to X and Y. Terms like "above/below" and "upper/lower" pertain to the perpendicular direction Z. It should be understood that the concepts of the invention discussed herein are not limited to these directional definitions and preferred orientations.

Lithography Unit

FIG. 1 schematically shows a perspective view of an exemplary target processing machine, such as a lithography unit 10 (or an inspection unit). A multitude of such lithography units 10 may be arranged side-to-side in an abutting manner to form a lithography unit cluster (not shown). The lithography unit 10 comprises (preferably at a lower side) a vacuum chamber 30 for accommodating a projection column 46 (see FIGS. 2a and 2b), and (preferably at an upper side positioned above the vacuum chamber 30) a cabinet 12 for accommodating electronic equipment 22. The electronic equipment 22 may be used for controlling devices, including parts of the projection column, which are accommodated inside the vacuum chamber 30. Linear bearing members (e.g. rails) 38 may be provided on a top side 32 of the vacuum chamber 30, forming guiding mechanisms for facilitating the positioning of the cabinet 12 on top of the vacuum chamber 30, or for moving the cabinet 12 forward with respect to the vacuum chamber 30 into a servicing position. In this configuration the vacuum chamber 30 supports the weight of the equipment cabinet 12 on its top surface.

The vacuum chamber 30 encloses a vacuum casing 39 (outer layer), a support casing 40 (intermediate layer), and a carrier casing 41 with a carrier frame 42 (innermost region). A projection lens assembly 50 is accommodated by the carrier frame 42 on the inside of the vacuum chamber 30. An embodiment of the vacuum chamber 30 and projection lens assembly 50 will be explained in more detail below with reference to FIGS. 2a and 2b.

Figure 2A:
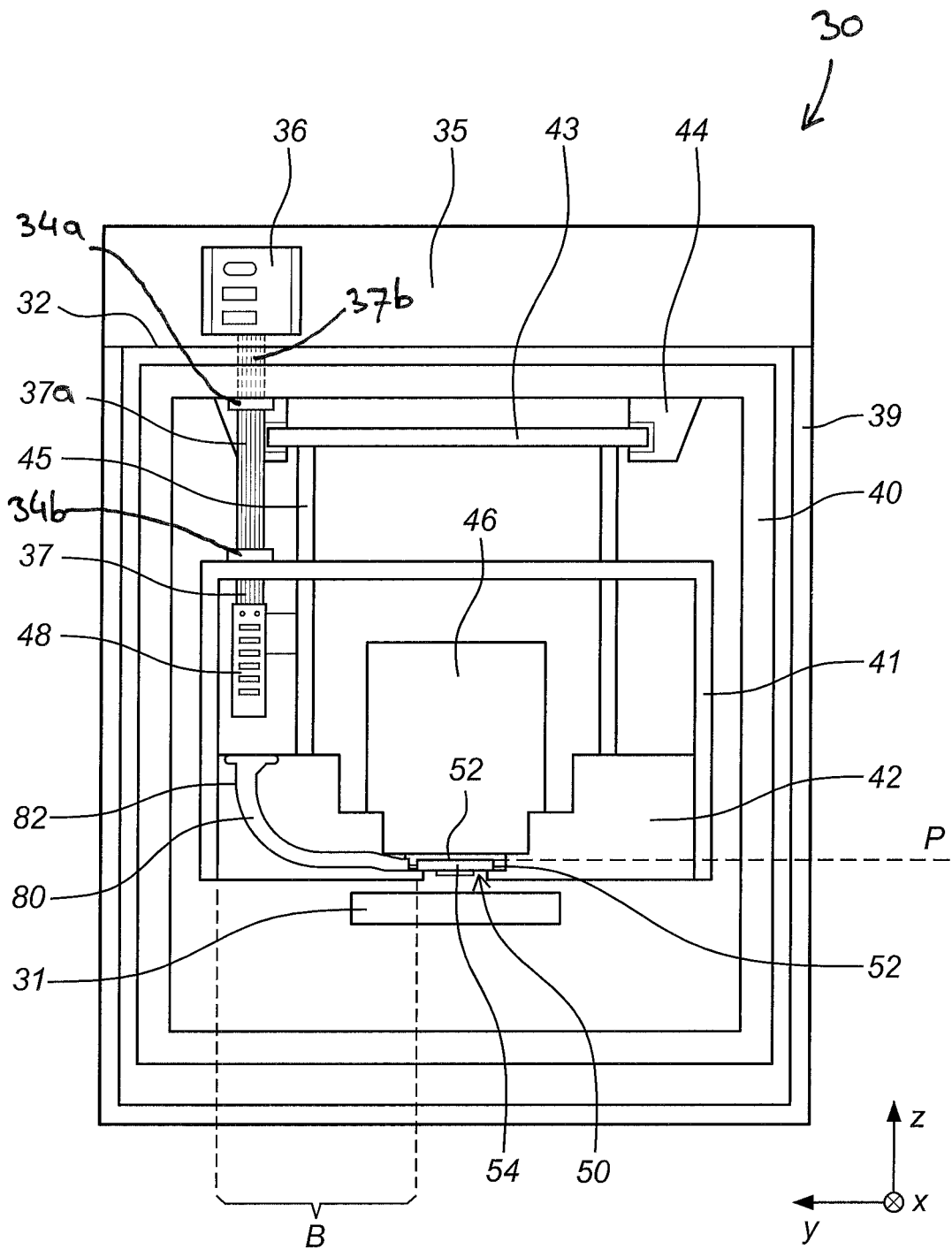
FIG. 2a presents a frontal view a vacuum chamber of an exemplary embodiment of a target processing unit.
Figure 2B:
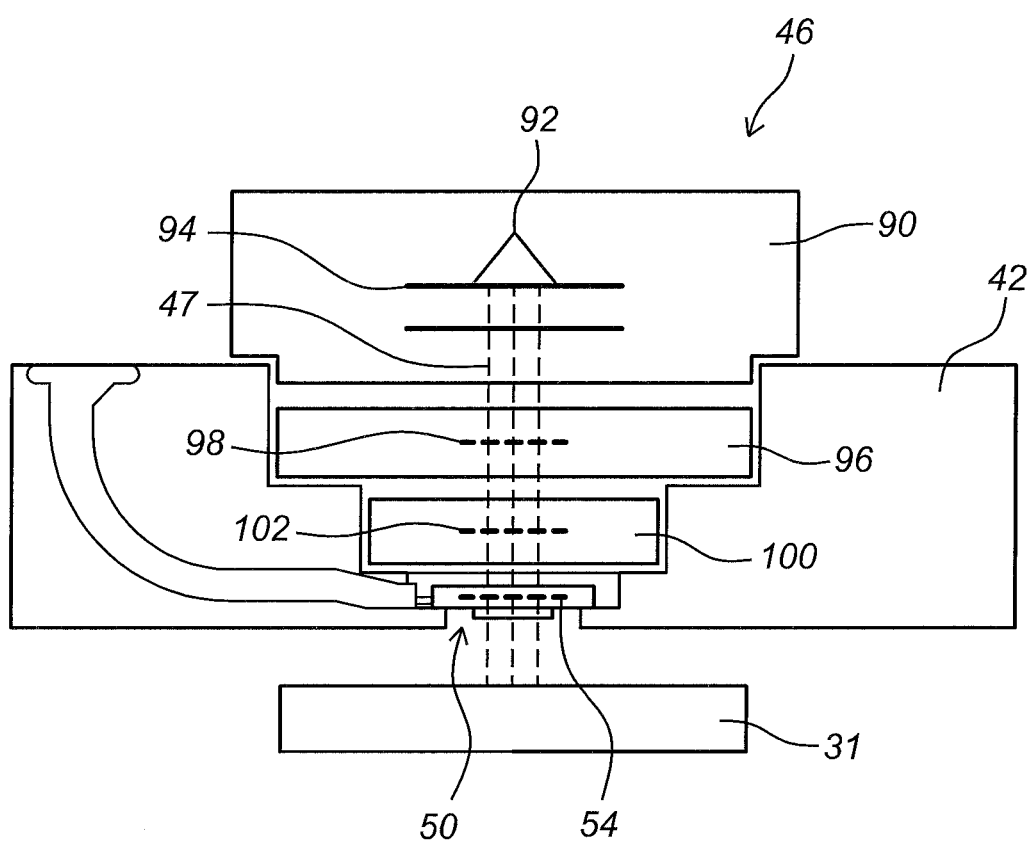
FIG. 2b shows a diagram of a modular projection column in an exemplary embodiment of a target processing unit.

FIG. 1 only shows the projection lens assembly 50 portion of the projection column 46. It should be understood that the carrier casing 41 is arranged to accommodate an entire projection column 46, for example as illustrated in FIGS. 2a and 2b. Parts of the projection column 46 are connectable to other equipment or devices in the target processing unit 10, such as to the electronic equipment 22. For example, in FIG. 1, the projection lens assembly 50 is connected to electronic equipment 22 via conduits 60, 37, 37a, 37b, and 26. Conduits may include cables, wires, tubes and/or fibers.

The projection lens assembly 50 comprises a flat lens support body 52 for accommodating lens elements 54, and a conduit guiding body for guiding conduits (60-64, see FIG. 3a-5a) laterally and upwards away from the lens support body 52 towards a connector panel 48 provided inside the vacuum chamber 30. As shown in FIGS. 1 and 2a, the connector panel 48 is provided on a lateral region B on the inside of the carrier casing 41. Preferably, the connector panel 48 is mechanically fixed to an inner upper portion of the carrier casing 41. Alternatively, the connector panel 48 may be attached to the carrier casing 41 in another suitable region. The connector panel 48 is provided with complementary connectors for connecting to distal ends of the conduits 60-64, to establish electrical, optical, and/or fluid communication between the projection lens assembly 50 and source devices and/or destination devices provided elsewhere in the target processing unit 10, e.g. electronic equipment 22 provided inside the cabinet 12. In this embodiment, the connector panel 48 and its complementary connectors are arranged in the perpendicular direction Z.

The projection lens assembly 50 is linearly insertable into the carrier frame 42 along a central axis A that is parallel with the longitudinal direction X, to assume an operational position wherein the projection lens assembly 52 forms part of a modular beam projection column 46 (see FIG. 2a-2b). The projection column 46 is configured to generate and manipulate one or several processing beams that are used for processing (or inspecting) a target 31 accommodated inside the vacuum chamber 30. This configuration with the insertable projection lens assembly 50, conduits 60-64, and connector panel 48 greatly facilitates modular installation and maintenance of the projection column 46.

As shown in FIG. 1, intermediate conduits 37 emanate from a rear side of the connector panel 48, and are guided on the inside of the vacuum chamber 30 via a predominantly vertical trajectory to an access port 36 located on a top side 32 of the vacuum chamber 30.

The intermediate conduits 37 comprise a first flexible curved intermediate portion 37a between the support casing 40 and the carrier casing 41. The first intermediate conduit portion 37a extends between two attachment members or anchors 34a, 34b. The first intermediate conduit portion 37a allows sufficient vibration/motion decoupling between the support casing 40 and the carrier casing 41, at least along the longitudinal direction X and perpendicular direction Z, and preferably in all directions. Typically, a displacement between the support casing 40 and the carrier casing 41 of several micrometers may easily be attenuated by the first flexible portion 37a.

Similarly, the intermediate conduits 37 comprise a flexible curved second intermediate portion 37b between the support casing 40 and the vacuum casing 39. The second intermediate conduit portion 37b extends between attachment member or anchor 34a and access port 36. The second intermediate conduit portion 37b allows sufficient vibration/motion decoupling between the support casing 40 and the vacuum casing 39, at least along the longitudinal direction X and perpendicular direction Z, and preferably in all directions. Typically, a displacement between the support casing 40 and the vacuum casing 39 of several micrometers may easily be attenuated by the second intermediate conduit portion 37b.

Hereinafter, the assembly formed by the connector panel 48, intermediate conduits 37, first attachment member 34a, first intermediate conduit portion 37a, second attachment member 34b, second intermediate conduit portion 37b, and access port 36, is referred to as an "intermediate conduit assembly" 108.

The vacuum chamber 30 may include or accommodate various equipment, devices, and/or components that contribute to the execution of the processing method performed on the target 31. Such equipment/devices/components may be provided with their own vibration damping and/or motion compensation system, or may be less susceptive to external mechanical vibrations. Such equipment/devices/components may also be connected to corresponding electronic equipment 22 inside the cabinet 12 via one or more conduits, for example to receive power, initialization/control signals, or cooling fluid, and/or to transmit measurement signals or other feedback data. An example hereof is a target positioning system, for positioning the target 31 (e.g. wafer) below the projection column 46. Furthermore, the electronic equipment 22 or other equipment in the cabinet 12 may be connected to equipment/devices/components outside of (e.g. located below) the target processing unit 10.

Hereinafter, equipment/devices/components that are connected to electronic equipment 22 or to other equipment in the cabinet 12 are referred to as "further equipment". The control cables, conduits and/or wiring connecting the electronic equipment 22 or other equipment in the cabinet 12 to the further equipment are referred to as "further conduits".

On the top side 32, the vacuum chamber 30 is provided with a recessed section 33 that comprises an interface wall 35. The interface wall 35 preferably extends over an entire width of the top side 32, and is typically oriented along the perpendicular direction Z while facing the longitudinal direction X (in opposite direction). The interface wall 35 is provided with the access port 36 for receiving and passing through the intermediate conduits 37 emanating from the vacuum chamber 30. The intermediate conduits 37 are subsequently guided to the inside of the cabinet 12, and connected to the electronic equipment 22 provided therein. Alternatively or in addition, the lithography unit 10 may be provided with multiple access ports, and/or with a rear interface wall at a rear side near the top side 32 of the vacuum chamber 30. This rear interface wall may have further access ports for passing through a portion of the intermediate conduits 37, or other conduits and wires belonging to further equipment/devices/components accommodated inside the vacuum chamber.

The cabinet 12 typically comprises a closable casing, formed by walls and having a front side 13 with an opening that provides access to the interior of the cabinet 12. The front side 13 includes two doors 15 for covering the opening in a sealing manner. The walls and cabinet doors 15 comprise solid panels, which are interconnected in an air-tight manner to form a cuboid shape. The cabinet 12 encloses an interior and accommodates one or more racks 18. A plenum 16 is formed between the opening and the front of the racks 18. Each rack 18 carries a plurality of shelves 20 for accommodating the electronic equipment 22, which comprise various electronic components. Such electronic components may include, without limitation, any number of power supplies, integrated circuits, memory modules, magnetic or optical, solid state storage media, audio hardware and/or video hardware.

The cabinet 12 is typically provided with a cooling mechanism, such as an air-fluid cooling mechanism comprising air circulators and a heat exchanger arrangement. In the embodiment shown in FIG. 1, the air circulators and heat exchanger are mounted in a separate cooler frame 24 positioned at a rear side of the cabinet 12. The casing and the cooler frame 24 are separately mountable on and repositionable along the rails 38.

The plenum 16 comprises a vertical wall portion 25 at a lateral (left) wall of the casing, for accommodating cabinet conduits 26 (e.g. electrical cabling, tubes with cooling fluid, or the intermediate conduits 37) that extend along the perpendicular direction Z.

In the lithography unit 10 embodiment shown in FIG. 1, there is also provided a vertical recess 27 located at an opposite lateral (right) wall of the casing. Here, the vertical recess 27 defines a rectangular cuboid void that forms a lateral part of the plenum 16 near the right wall. The vertical recess 27 extends vertically along substantially the entire right wall. The lateral vertical recess 27 allows to direct signal and/or power conduits 26 to and from the corresponding equipment 22 without obstructing a cooling airflow circulating inside the casing, and through the plenum 16 in particular. In other embodiments, the recess 27 may alternatively or in addition be provided on the left wall of the casing.

The vertical wall portion 25 (and/or vertical recess 27) is provided with fastening means to retain the cabinet conduits 26 along a desired part of the vertical wall portion 25. At the respective equipment locations, the cabinet conduits 26 branch off from the vertical wall portion 25 (and/or the vertical recess 27) to form a connection with a front side of a corresponding electronic equipment unit 22.

Near a bottom of the vertical wall portion 25 (and/or recess 27) and at a lateral side of the plenum 16, the cabinet 12 comprises a floor aperture 28, for guiding cabinet conduits 26 into/out of the cabinet 12.

Vacuum Chamber

FIG. 2a presents a frontal view of a vacuum chamber 30 in one embodiment of a target processing unit 10. The vacuum chamber 30 is provided with a vacuum casing 39 that is sealable and configured for applying a vacuum on an inside thereof, to allow processing of a target 31 in a vacuum environment (typically $10^{-3}$ bar or lower). The vacuum chamber 30 is arranged for accommodating the target 31 and the projection column 46 for processing the target 31 on the inside of the vacuum chamber 30. The vacuum chamber 30 comprises the vacuum casing 39 (outer layer), a support casing 40 (intermediate layer), and a carrier casing 41 (innermost region) with a carrier frame 42. The projection column 46 with projection lens assembly 50 is accommodated and supported by the carrier frame 42 on the inside of the vacuum chamber 30, and located within a space defined inside the carrier casing 41. In applications using charged particle beamlets, the carrier casing 41 is preferably made of a magnetically shielding material.

The carrier casing 41 and carrier frame 42 are typically moveably suspended inside of and with respect to the support casing 40, by means of suspension members 44 (e.g. leaf springs), which are for example connected to a suspension base 43. The suspension base 43 is moveably interconnected with the carrier casing 41 by means of a plurality of rigid but laterally hingeable suspension rods 45. The connector panel 48 and its complementary connectors 49 are provided on an inside of the carrier casing 41. The connector panel 48 is vertically arranged along perpendicular direction Z in the lateral region B, with its surface normal directed along and opposite to the longitudinal direction X, and located next to the projection column 46. The intermediate conduits 37 emanate from a rear side of the connector panel 48 and are guided via an aperture in the carrier casing 41, along the first flexible curved intermediate portion 37a, to the support casing 40. The first flexible curved intermediate portion 37a between the support casing 40 and the carrier casing 41 allows sufficient vibration/motion decoupling between the support casing 40 and the carrier casing 41, at least along the longitudinal direction X and the perpendicular direction Z. The intermediate conduits 37 further comprise a second flexible curved intermediate portion 37b between the support casing 40 and the access port 36 located on the interface wall 35.

Projection Column

FIG. 2b shows a schematic diagram of a projection column 46 in one embodiment of a lithography unit 10. The projection column 46 is configured to generate and manipulate one or several processing beams 47 that are used for processing (or inspecting) a target 31 accommodated inside the vacuum chamber 30. The projection column 46 may be modularly implemented, such as shown in FIG. 2b. The optical elements are grouped into modules, which can be independently removed from the lithography unit 10. The modular subsystems may comprise an illumination optics module 90 including a charged particle beam source 92 and a beam collimator array 94, a condenser lens module 96 including an aperture array and a condenser lens array 98, a beam switching module 100 including a beamlet blanker array 102, and a projection lens assembly 50 with lens element(s) 54. The projection lens element(s) may comprise a beam stop array, a beam deflector array, and a projection lens array, which are jointly indicated with reference numeral 54. The beam stop array may comprise an array of apertures for blocking beamlets 47 that have been subjected to a blanking deflection by the beamlet blanker array 102, and for letting through beamlets 47 that have not been subjected to a blanking deflection by said beam blanker array 102. The beam deflector array is preferably arranged downstream of said beam blanker array 102. The projection lens array comprises planar lens electrodes near a lower edge of the projection lens assembly 50. The planar lens electrodes each comprise an array of lens apertures for letting through and focusing beamlets 47, with lens apertures aligned with apertures of vertically corresponding beamlet manipulation elements. The carrier frame 42 may comprise a multi-leveled staircase profile of support regions, each providing an accommodation space for a corresponding module 50, 90, 96, 100.

Projection Lens Assembly

Figure 3A:
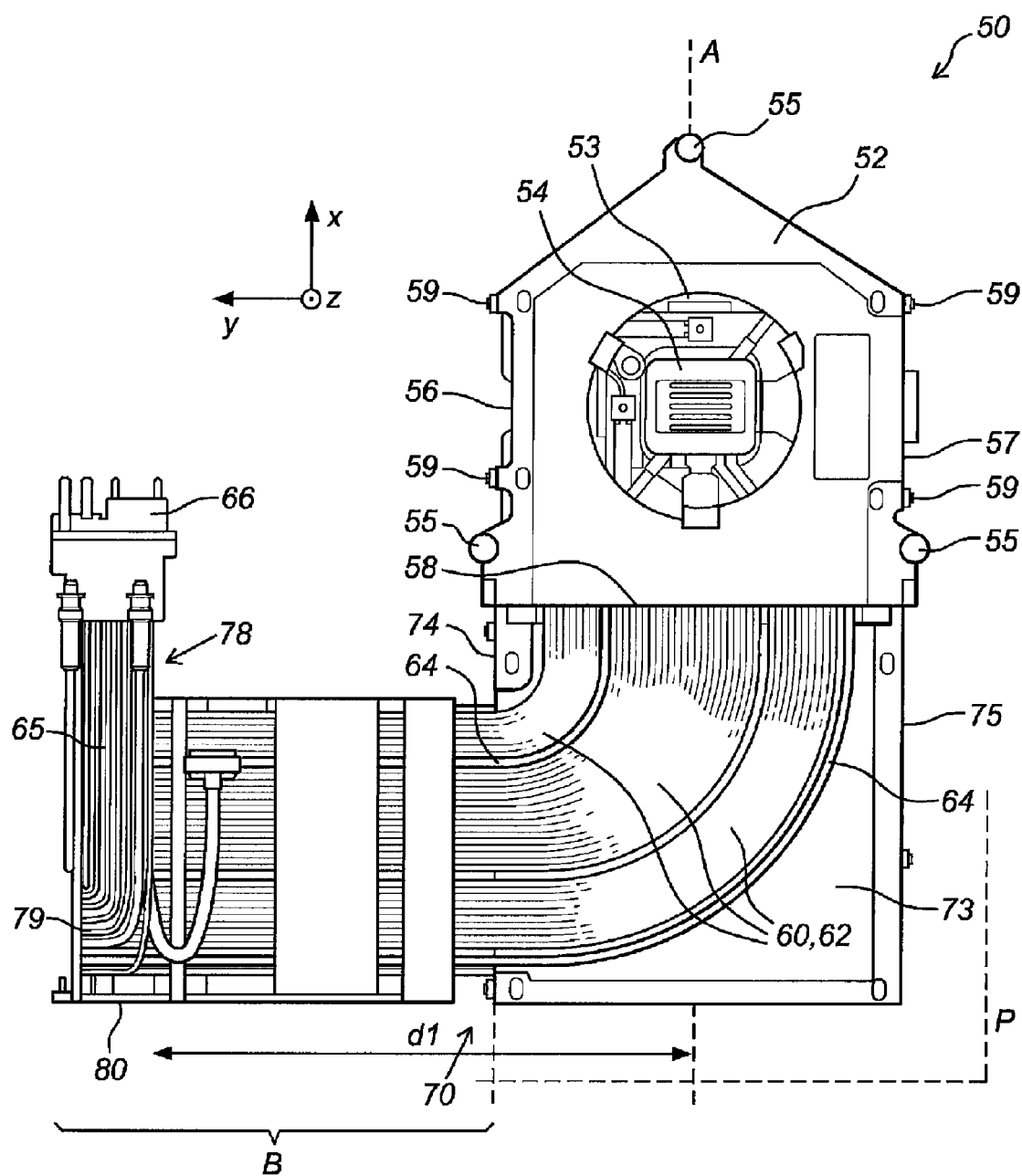
FIG. 3a shows a top view of an embodiment of a projection lens assembly.

FIG. 3a schematically shows a top view of a projection lens assembly 50 configured for positioning in the carrier frame 42. Components of the projection lens assembly 50 may require power, control signals, cooling fluids, and/or other electric or fluid communication with source and/or destination devices provided in the lithography unit 10. On one end, conduits 60 are connected to components of the projection lens assembly 50. Connectors 66 provided at distal ends 65 of the conduits 60 are connectable to complementary connectors 49 provided on a front side of the connector panel 48.

The projection lens assembly 50 comprises a flat lens support body 52 for accommodating lens elements 54, a plurality of conduits 60-64 emanating from a rear edge 58 of the lens support body 52, and a conduit guiding body 70 for guiding the conduits 60-64 laterally and upward away from the lens support body 52 toward the connector panel 48 provided on the lateral region B on the inner side of the carrier casing 41. In this embodiment, the lens support body 52 is formed by a regular pentagonal support plate made from a mechanically rigid and magnetically shielding material. The polygonal support plate 52 has two opposite lateral edges 56, 57 that are both parallel with the longitudinal direction X. The rear plate edge 58 faces opposite to the longitudinal direction X. Two remaining frontal edges form an apex with a forward projecting corner.

The polygonal support plate 52 is provided with three substantially spherical abutment members 55. Alternatively, the abutment members 55 may have any suitable shape (e.g. truncated spheroid, oblate ellipsoid). The lens support body 52 is provided with a lens cut-out 53 for accommodating one or several lens elements 54, for manipulating beam(let)s 47 emitted from a beam source 92 (e.g. generated by the projection column 46). The projection lens assembly 50 and the other modules (e.g. illumination optics module 90, condenser lens module 96 and/or beam switching module 100) of the projection column 46 are to be inserted into the carrier frame 42 in such a manner that, in the case that the abutment members 55 are positioned against the alignment surfaces, a beam projection axis of the projection column 46 will substantially coincide with the (thermal) center of the lens element 54 in the lens support body 52.

The conduit guiding body 70 is provided along the rear edge 58 of the lens support body 52, and comprises a lateral conduit guiding portion 72 (also refereed to as first guiding portion) and a vertical conduit guiding portion 78 (also referred to as second guiding portion). The first guiding portion 72 comprises a predominantly quadrilateral support plate 73 made from a mechanically rigid and magnetically shielding material. In this embodiment, the quadrilateral support plate 73 forms a rectangular plate arranged within the plane P, and comprising two further opposite lateral edges 74, 75 that are both parallel with the longitudinal direction X. The right further opposite lateral edge 75 forms a parallel extension of opposite lateral edge 57.

Guiding wheels 59 are provided along the opposite lateral edges 56, 57, for facilitating positioning the lens support body 52 into the carrier frame 42 along the longitudinal direction X while keeping the support body 52 leveled with the plane P.

The conduit guiding body 70 FIG. 3*a* further comprises a sledge 80 in the lateral region B. The sledge 80 comprises the second guiding portion 78 and possibly part of the first guiding portion 72. The conduits 60-64 are accommodated inside the sledge 80 and are curved from a planar locally parallel configuration along the transversal direction Y to a planar locally parallel configuration along the perpendicular Z. The outer contour of the sledge 80 is substantially linearly symmetric along the longitudinal direction X. The conduits 60-64 emanate from the sledge 80 at a tilted edge 79 that runs parallel with the longitudinal direction X. Each conduit 60-64 is provided with a conduit connector 66 at a distal conduit end 65. These conduit connectors 66 are arranged for connecting the conduits 60-64 to complementary connectors 49 provided on the connector panel 48. The carrier frame 42 may be provided in the lateral region B with a cut-out 82 having a shape complementary to at least a part of the conduit guiding body 70, such as the sledge 80.

Figure 3B:
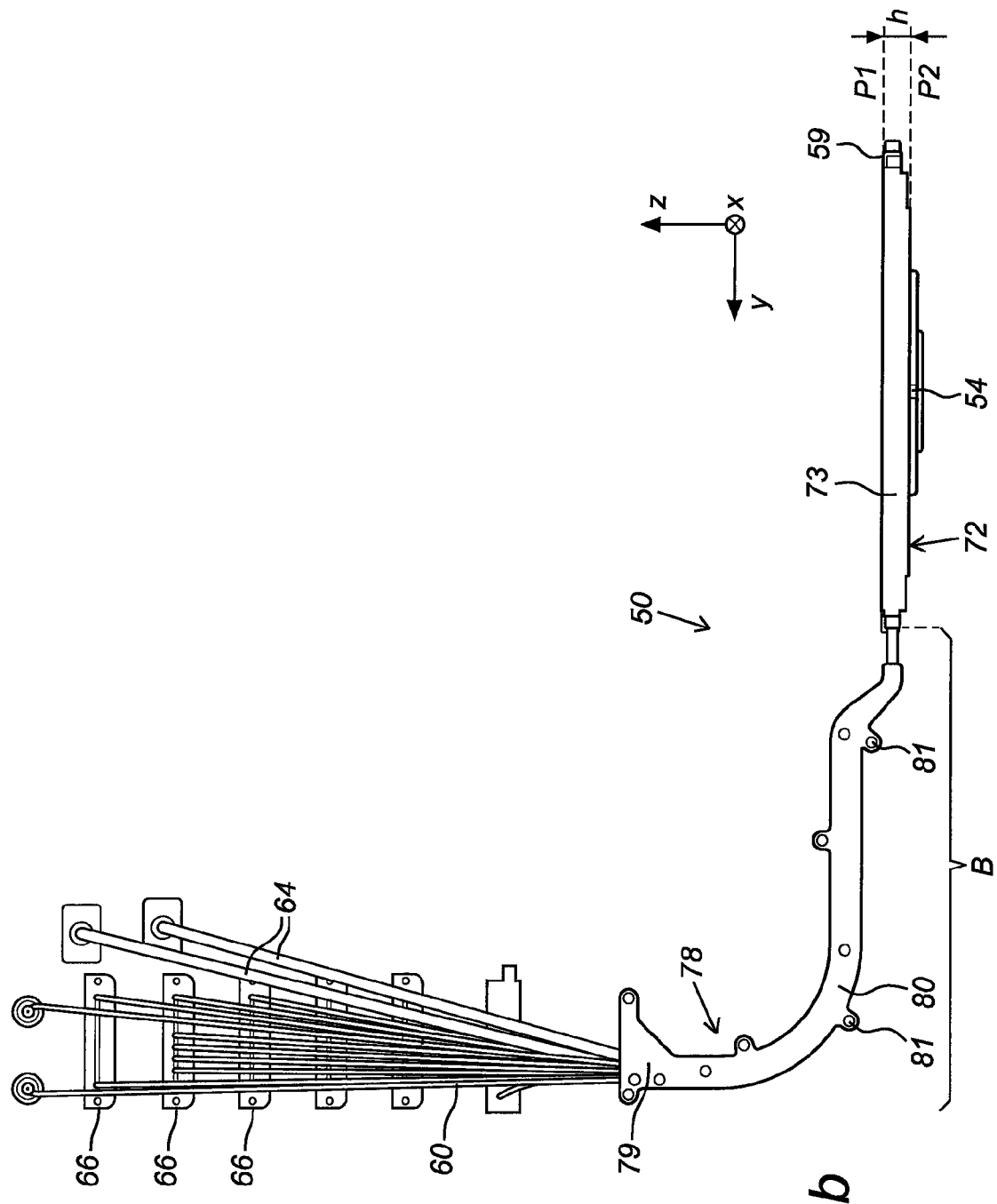
FIG. 3b shows a rear view of an embodiment of a projection lens assembly.

FIG. 3*b* shows a rear view of the embodiment for the projection lens assembly 50 illustrated in FIG. 3*a*, viewed along the positive longitudinal direction. Here, it is shown that an outer circumference of the conduit guiding body may be substantially linearly symmetric along the longitudinal direction X. As shown in FIG. 3*b*, the quadrilateral support plate 73 is bounded from above (along the perpendicular direction Z) by a first plane P1, and bounded from below (along the perpendicular direction Z) by a second plane P2. The first and second planes P1, P2 are mutually parallel, as well as individually parallel with the plane P. A typical distance between the first plane P1 and the second plane P2, i.e. a typical height h of the quadrilateral support plate 73 for the projection lens assembly 50 is in a range of 3 millimeters to 10 millimeters, and preferably about 5 millimeters. Typical dimensions for the support plates 52, 73 in the transversal directions may be in the order of 15 to 25 cm.

FIG. 3*b* shows that the conduits 60-64 accommodated in the first guiding portion 72 (which in this embodiment comprises the quadrilateral support plate 73) remain confined between the first and second planes P1, P2, up to the lateral region B at which the conduits 60-64 laterally emanate from the quadrilateral (rectangular) support plate 73. In the lateral region B, the conduits 60-64 enter the second guiding portion 78 comprising the upwardly curved sledge 80, and traverse the sledge 80 up to the tilted edge 79.

FIG. 3*b* shows that the sledge 80 may include sledge guiding members 81 for facilitating positioning of the sledge into the carrier frame 42. The sledge guiding members 81 linearly extend along the sledge 80 and parallel with the longitudinal direction X. In the shown embodiment, the projection lens assembly 50 forms the lowermost module of the projection column 46. Hence, the projection lens element 54 is allowed to protrude a small distance downward beyond the second plane P2.

Figure 4:
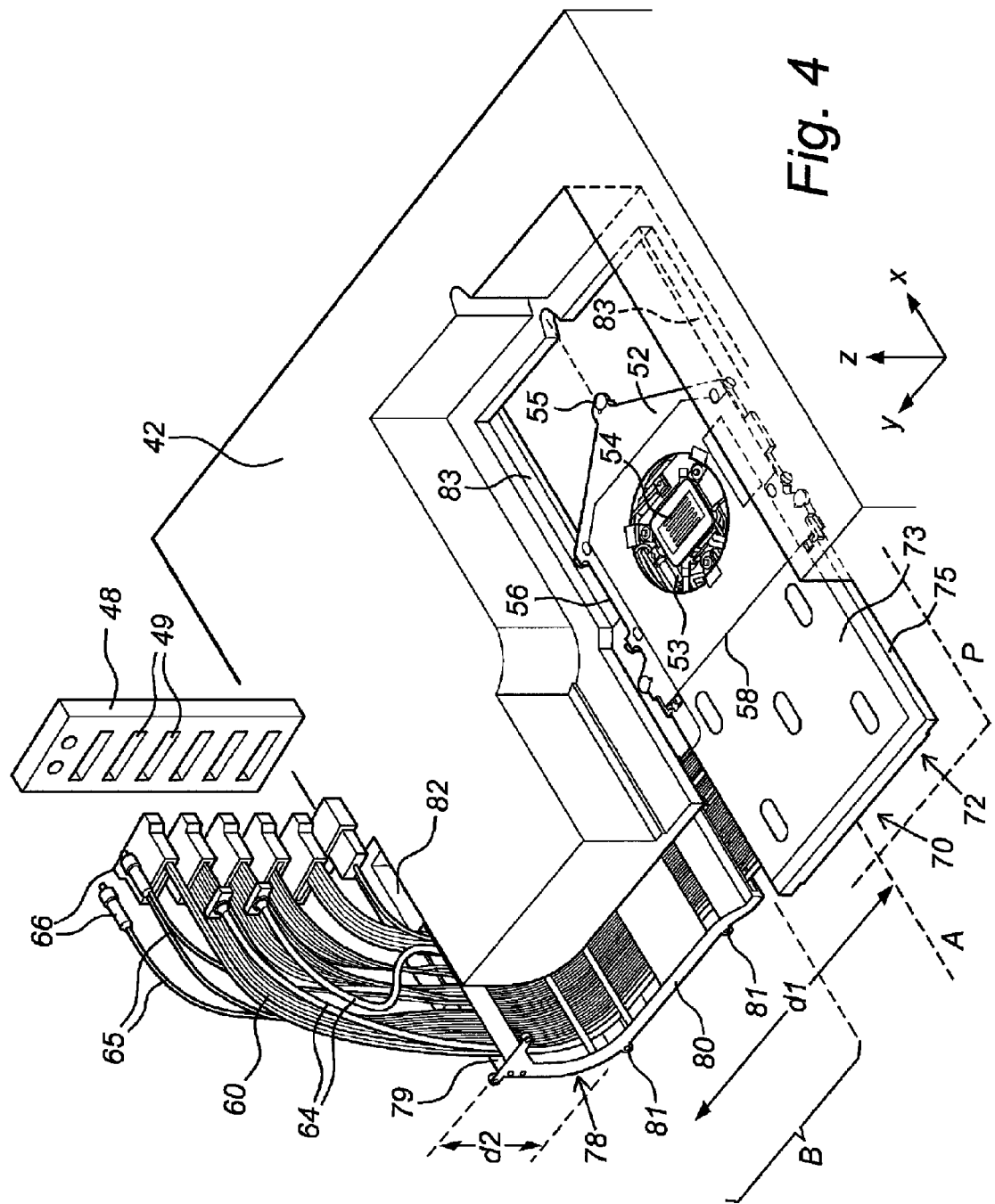
FIG. 4 shows a perspective view of a projection lens assembly and a carrier frame of an exemplary embodiment of a target processing unit.

FIG. 4 shows an exemplary carrier frame 42, comprising a layered stack of support surfaces and forming a predominantly rectangular U-shape (viewed along perpendicular Z). The carrier frame 42 is provided with inserts for the projection column 46 and the projection lens assembly 50. These inserts comprise alignment surfaces and support surfaces for the respective modules (e.g. further rails 83). The carrier frame 42 comprises three planar alignment surfaces that are angularly offset with respect to each other. The carrier frame 42 includes further rails 83 arranged along the longitudinal direction X for supporting and guiding the lens support body 52 during insertion thereof into the carrier frame 42. The guiding members 59 (e.g. wheels) on the lens support body 52 are adapted to cooperate with the further rails 83.

The lens support body 52 is insertable into the carrier frame 42 along central axis A that is parallel with the longitudinal direction X. When arranged within the carrier frame 42, each of the three abutment members 55 lies alongside against a corresponding one of the three alignment surfaces. To ensure that the abutment members 55 stay in contact with the corresponding alignment surfaces, a force may be applied on said module in order to push the abutment members 55 against the alignment surfaces.

The connectors 66 provided at the distal ends 65 of the conduits 60-64 are connectable to the complementary connectors 49 provided on a front side of the vertically arranged connector panel 48.

Figure 5A:
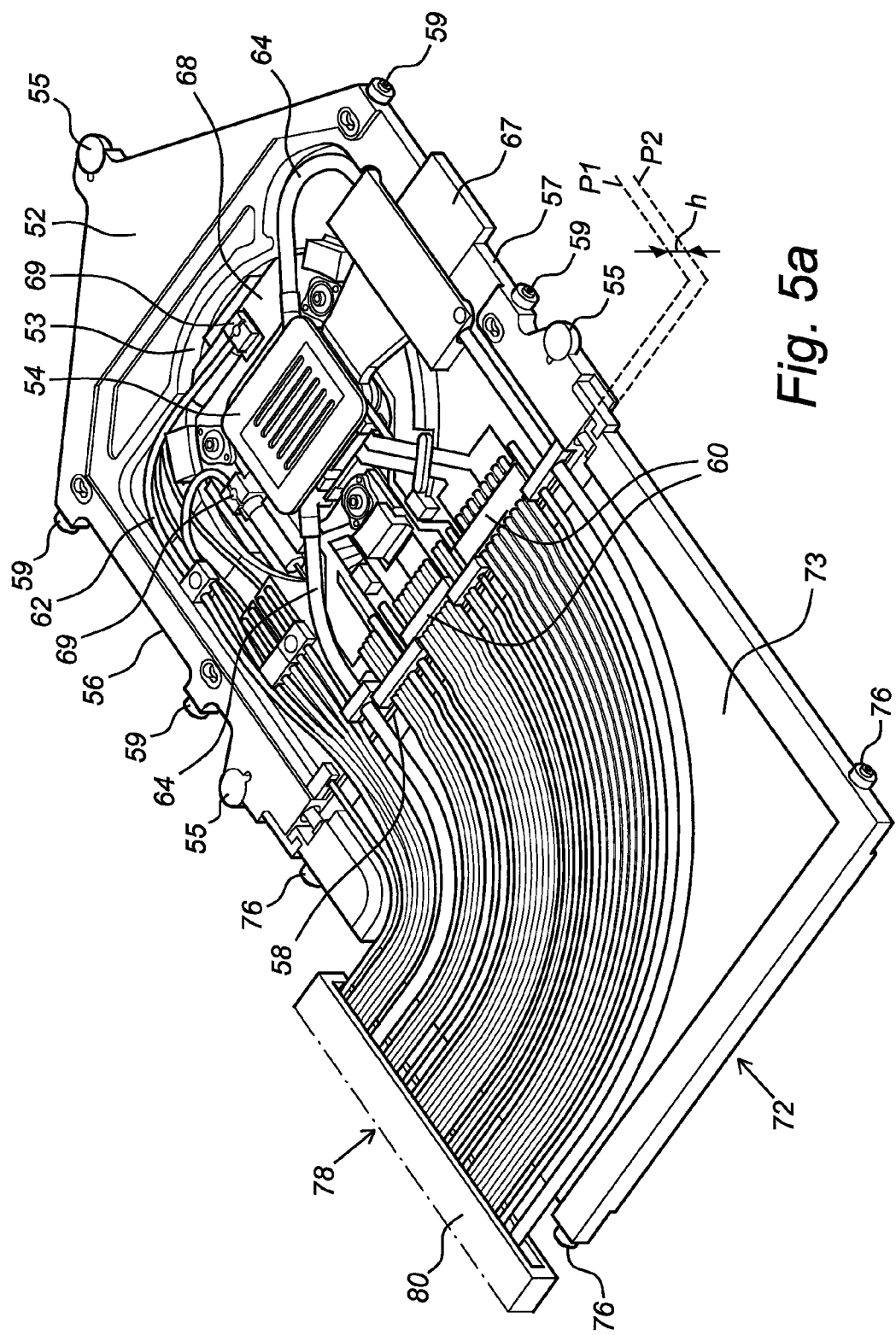
FIG. 5a shows a perspective view of a portion of an embodiment of a projection lens assembly.

FIG. 5*a* shows a perspective view of a top portion of a projection lens assembly 50 according to an embodiment. The pentagonal support plate 52 and rectangular support plate 73 are depicted with protective cover plates removed, to show the conduit arrangement. The projection lens assembly 50 comprises a projection lens element 54 that is formed by a vertical stack of beam manipulation elements. For example, the projection lens element 54 may comprise any or all of: a beam stop array, comprising an array of apertures for blocking charged particle beamlets with a blanking deflection by a beam blanker and letting through charged particle beamlets without a blanking deflection by said beam blanker; a plurality of electrodes (preferably arranged in or near a plane defined by a downstream distal edge of the projection lens assembly), said electrodes each comprising a lens hole-array aligned with the through-opening for allowing passage to transmitted charged particle beamlets, and a deflector unit (preferably arranged upstream of said electrodes and downstream of said beam blanker).

Each of such lens elements 54 may require power, control signals, cooling fluids, and/or other electric or fluid communication with source and/or destination devices provided in the lithography unit 10. For example, the beam stop array may require cooling by an external cooling arrangement, which is used to supply cooling fluid to (and discharge it from) the beam stop array via cooling conduits 64. The lens electrodes may require communication using electrically conducting conduits 60 with electrical sources that are arranged to apply electric potential differences between the lens electrodes. The beam deflector unit may similarly require electrical communication via signal conduits 60. Other components of the lens element 54 may require power from a remote source using conduits 62 that convey electrical power, for example to feed alignment sensors 69 provided on or around the lens element 54. Such sensor 69 may additionally require control and feedback communication via further signal conduits (e.g. optical fibers).

The various conduits 60-64 (cables/wires/tubes/fibers) are connected to the projection lens element 54 according to a spatial arrangement that is parallel with the plane P. The projection lens element 54 is suspended by means of a lens carrier ring 68 inside the circular lens cut-out 53 provided in the pentagonal support plate 52. The lens carrier ring 68 may comprise material with a relatively low thermal expansion coefficient, and/or may be thermally stabilized via closed loop (active feedback) position control (e.g. using optical and/or capacitive alignment sensors 69). The conduits 60-64 are connected to the lens carrier ring 68 and/or the lens element 54 in various directions from various locations on the lens support body 52 and along the circumference of the circular lens cut-out 53. Typical transversal dimensions of the pentagonal support plate 52 are substantially larger than the typical height h of the pentagonal support plate 52. The pentagonal support plate 52 defines one or more voids along the circumference of the circular lens cutout 53. These one or more voids provide room for the conduits 60-64 to be curvedly guided from the various initial locations around the lens cut-out 53 through the pentagonal support plate 52 toward the rear edge 58. As a result, the conduits 60-64 are connectable to the lens element 54 from many directions along the circumference of the lens cut-out 53, while the conduits 60-64 do not need to cross along their paths to the rear edge 58.

Along lateral edge 57, the pentagonal support plate 52 may further comprise a cleaning agent supply tube 67, which traverses the pentagonal support plate 52 and emanates with a rectangular aperture at the circular lens cut-out 53 near the lens elements 54. This supply tube 67 allows supply of reactive agents (e.g. a stream of plasma with ions and radicals) from an external cleaning agent source (not shown) to the lens elements 54, for removing contamination deposits that have accumulated on the abovementioned lens elements 54 as a result of electron beam processing. Supply tube 67 has a flat rectangular cross-sectional shape.

As shown in FIG. 5a, and similar to the embodiment described herein above with reference to FIG. 3b, the pentagonal support plate 52 is vertically bounded by first plane P1 second plane P2. The conduits 60-64 are joined toward the rear edge 58 and preferably emanate from the rear edge 58 in a parallel (i.e. non-crossing) planar arrangement that is confined between the first plane P1 and the second plane P2. From the rear edge 58, the conduits 60-64 enter the quadrilateral support plate 73 (part of the first guiding portion 72). Inside the quadrilateral support plate 73, which is also vertically confined between the first plane P1 and the second plane P2, the conduits 60-64 are curvedly guided in a locally parallel configuration with a bend to the side (here shown along the positive Y-direction) and toward the lateral region B that is bounded by the first lateral edge 56 of the pentagonal support plate 52. In this embodiment, the first lateral edge 56 forms an extension of the first further lateral edge 74 of the quadrilateral support plate 73.

The conduits 60-64 emanate from the first further lateral edge 74 in a locally parallel arrangement which is directed predominantly along the lateral direction Y. Here, the conduits 60-64 enter the second guiding portion 78 as described herein above.

In other embodiments, one or several of the conduits 60-64 may be arranged to cross at some points within the lens support body 52 (e.g. the pentagonal support plate) or the first guiding portion 72 (e.g. the quadrilateral support plate 73), instead of being arranged locally parallel everywhere. This may increase the height required for accommodating the conduits, which may undesirably result in an accommodation height that surpasses the region (height h) bounded by first plane P1 and second plane P2.

Figure 5B:
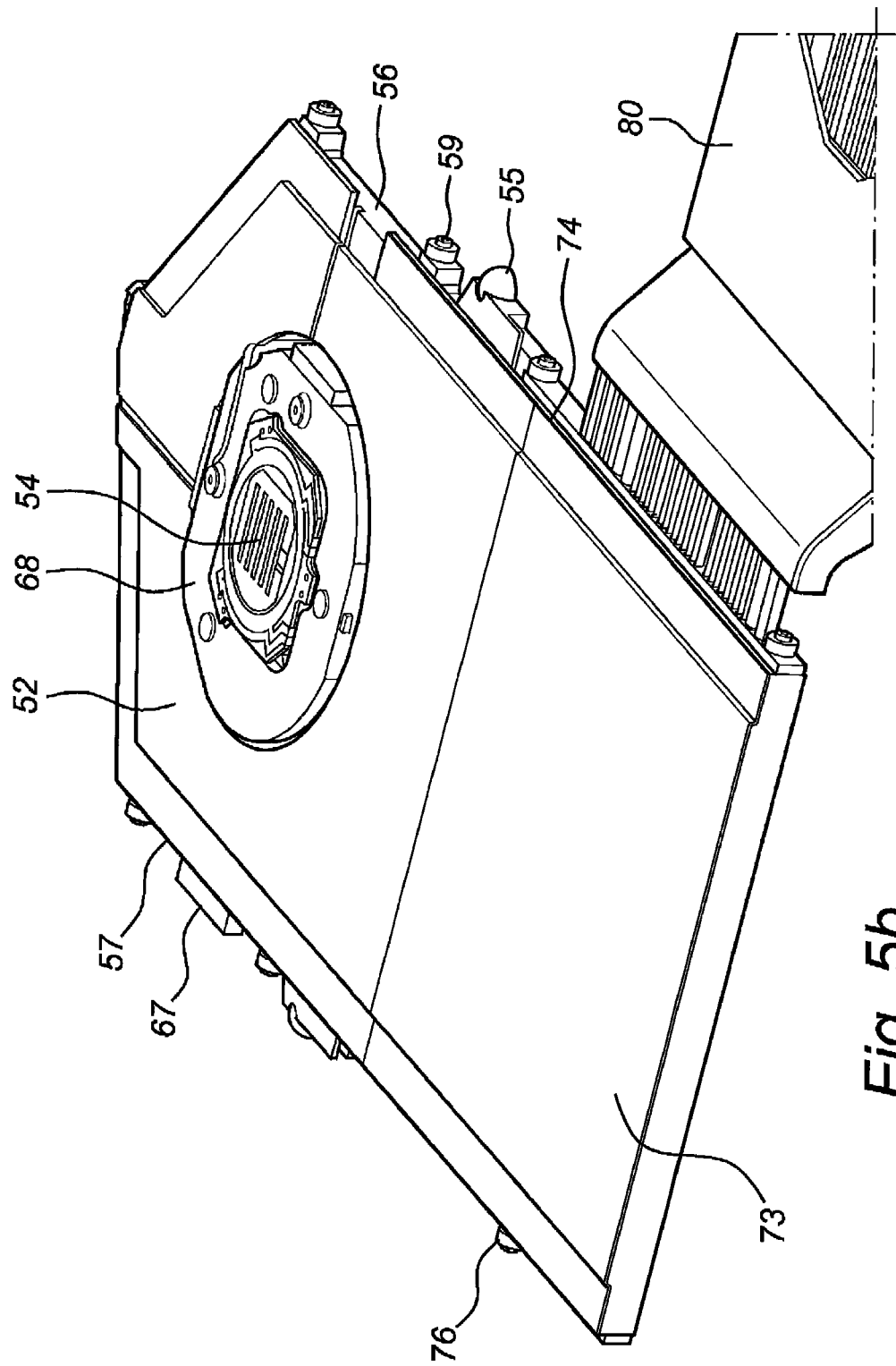

FIG. 5b shows a perspective backside view of the projection lens assembly 50 of FIG. 5a. Lower sides of the pentagonal support plate 52 and rectangular support plate 73 form closed surfaces that provide electromagnetic shielding (e.g. with respect to the target 31 located below).

The descriptions above are intended to be illustrative, not limiting. It will be apparent to the person skilled in the art that alternative and equivalent embodiments of the invention can be conceived and reduced to practice, without departing from the scope of the claims set out below.

For example, the inventors found that the spatial configurations for the modular projection assemblies described herein above are particularly beneficial if applied in a projection lens assembly, which preferably is very thin in the perpendicular (vertical) direction (e.g. having a height h as shown in FIGS. 3b and 5a) to yield a small focal length for the projected beam(s). Such a thin projection module benefits from a planar configuration of conduits and guiding means, which serves to keep the conduits within the bounds of the required thickness. However, it is possible to apply the proposed configurations in projection assemblies or modules that may carry other beam manipulation components, either alternatively or in addition to the projection lens. Hence, modular projection element assemblies described herein above but arranged for accommodating other beam manipulation components are considered to be inventive in and of its own right in the present context, and may be subject of a separate patent application. Correspondingly, the terms "projection lens assembly", "lens support body", and "lens element" as described and claimed herein may also be rephrased more generically as "beam manipulation module assembly", "beam manipulation element support body", and "beam manipulation element" respectively.

Further Aspects

In the semiconductor industry, an ever-increasing desire exists to manufacture smaller structures with high accuracy and reliability. In lithography systems, this desire results in extremely high demands with respect to positioning and orientation. External vibrations caused by other machines in a fab environment and/or electrical circuitry may have a negative influence on the positioning accuracy within the lithographic apparatus. Similarly, vibrations within a lithographic apparatus, for example caused by stage movement, may have a negative influence on such accuracy.

It may generally be desirable to provide a compact arrangement of further equipment (i.e. target processing equipment) and their corresponding cables and conduits inside the vacuum chamber, as well as an arrangement of intermediate cables and conduits needed for connecting further equipment inside the vacuum processing chamber to corresponding equipment inside the control and monitoring cabinet.

The cables and conduits are preferably arranged to contribute to one or more of the below three goals:

the internal layout of each processing unit enables a side-by-side arrangement of distinct processing units with a minimal footprint, by promoting front side accessibility for the majority of modules and/or devices accommodated inside each unit;

the modular arrangement of modules/devices and conduits inside each processing unit facilitates separate replacement of such modules/devices and conduits, by forming and positioning modules/devices and corresponding cables in a manner that promotes movability along the longitudinal direction while reducing obstruction of other modules/devices along this direction;

the grouped arrangement of conduits inside a processing unit is sufficiently mechanically separated to promote distinct motional/vibrational decoupling per module/device to the extend needed for that particular module/device, and the grouped arrangement of conduits inside a processing unit supports the modular concept by providing separate conduit paths for modules/devices that belong to the projection optics column and for modules/devices that do not, resulting in a vacuum space for the projection optics column that is occupied by a reduced or even minimal number of conduits belonging to non-column related modules/devices.

To meet one or several of the above-mentioned goals, a target processing unit may be provided with a cable distribution arrangement that comprises at least one of an intermediate conduit assembly and a vertical cable guiding casing as described herein below.

It would be desirable to reduce vibrations within a lithography unit as much as possible.

Therefore, according to an aspect there is provided a target processing unit comprising an access port for detachably connecting electronic equipment, and a connector panel for detachably connecting one or more parts of a projection column. The access port can be at least partly located outside of the target processing unit. The connector panel can be located inside of the target processing unit. The access port and the connector panel are connected in a vibrational/motional decoupled manner via one or more intermediate conduits.

The target processing unit may for example be formed by a lithography unit similar to the embodiments described herein above. The one or more parts of the projection column may include an illumination optics module including a charged particle beam source and a beam collimator array, a condenser lens module including an aperture array and a condenser lens array, a beam switching module including a beamlet blanker array, and/or a projection lens assembly with lens elements. The lens elements of the projection lens assembly may include a beam stop array, a beam deflector array and/or a projection lens array.

The access port is accessible from the outside of the target processing unit, or at least accessible without exposing the projection column to the atmosphere outside of the part of the target processing unit where the projection column resides. This enables electronic equipment to be connected to the access port without sacrificing the vacuum environment that typically surrounds the projection column.

The connector panel within the target processing machine provides a detachable connection (e.g. and electrical or optical signal connection) between parts of the projection column on the one hand, and the electronic equipment on the other hand. The physical portions for realizing this connection may for example be routed via the connector panel, the access port and the intermediate conduits.

Conduits may include cables, wires, tubes and/or fibers. The conduits may be used for data communication (electrically and/or optically), power distribution and/or transportation of cooling fluid.

The access port may be prone to mechanical vibrations, e.g. originating from fans or other moving elements within the electronic equipment or other equipment close to the access port. Mechanical vibrations may be transferred to the access port via the conduits connecting the electronic equipment to the access port or via a mechanical structure connected (directly or indirectly) to the access port.

By vibration/motion decoupling the access port from the connector panel, the negative influence of mechanical vibrations at the access port on the positioning accuracy within the lithographic apparatus, of which the projection column is most vulnerable, may be minimized or even nullified. The vibration/motion decoupled connection of the access port to the connector panel via the intermediate conduits results in sufficient attenuation of vibrations for the positioning accuracy of the projection column not to be negatively influenced when parts of the projection column are connected to the connector panel via one or more conduits.

In an embodiment, the intermediate conduits can be provided with one or more curved flexible intermediate conduit portions, which are configured to provide the vibration/motion decoupling between the access port and the connector panel.

In an embodiment, the target processing unit can comprise a cabinet for accommodating the electronic equipment. The target processing unit can further comprise a vacuum chamber for accommodating the projection column. The projection column can be arranged for generating, shaping, and directing a beam toward a target. The one or more parts of the projection column, such as a projection lens assembly, can be communicatively connectable to the electronic equipment via one or more conduits. The vacuum chamber can comprise a vacuum casing arranged for providing a vacuum environment within the vacuum chamber. The vacuum chamber can further comprise a support casing within the vacuum casing arranged for supporting a carrier casing. The vacuum chamber can further comprise the carrier casing within the support casing arranged for supporting the projection column. The target processing unit can further comprise an intermediate conduit assembly at least partly comprising the one or more conduits. The intermediate conduit assembly can comprise the connector panel attached to an inner side of the carrier casing. The intermediate conduit assembly can further comprise a second attachment member connected to an outer side of the carrier casing. The intermediate conduit assembly can further comprise the one or more intermediate conduits emanating from the connector panel and guided to the second attachment member. The intermediate conduit assembly can further comprise a first attachment member attached to an inner side of the support casing. A first flexible intermediate conduit portion of the one or more intermediate conduits can extend between the first attachment member and the second attachment member. The intermediate conduit assembly can further comprise the access port attached to an outer side of the vacuum casing. A second flexible intermediate conduit portion of the one or more intermediate conduits can extend between the first attachment member and the access port.

Preferably, the cabinet is located on top of the vacuum chamber, but alternatively the cabinet may be placed adjacent (i.e. in a side-by-side manner) to the vacuum chamber.

The cabinet typically contains a rack (i.e. frame, chassis or collection of shelves mounted on vertical supports) for mounting electronic equipment. The rack may be chosen to be compliant with the international 19-inch rack standard IEC 60297-3-100. Besides electronic equipment the cabinet may support other equipment, such as a heat exchanger or other cooling arrangements for cooling the electronic equipment and/or parts of the projection column via cooling conduits.

The vacuum chamber is provided with a vacuum casing that allows processing of a target in a vacuum environment (typically 10-3 bar or lower). The projection column is typically accommodated by a carrier frame on the inside of the vacuum chamber, i.e. within the carrier casing.

The connector panel and the second attachment member are both connected to the carrier casing. The second attachment member is used to guide the intermediate conduits from within the carrier casing (i.e. from the connector panel) to an outer side of the carrier casing. The intermediate conduits are fixed to the carrier casing by the second attachment member to keep the intermediate conduits in place. The second attachment member is not meant to make a connection (i.e. electrically, optically or fluidly) with the conduits.

The first attachment member is connected to the support casing and used to fix the intermediate conduits to the support casing. As with the second attachment member, the first attachment member is not meant to make a connection (i.e. electrically, optically or fluidly) with the conduits.

The first intermediate conduit portion comprises the part of the intermediate conduits that extends between the first and second attachment members. The first intermediate conduit portion is flexible and provides vibration/motion decoupling between the support casing and the carrier casing to minimize or eliminate the transfer of mechanical vibrations to the projection column.

The access port is connected to the vacuum casing, such that at least a part of the access port is accessible from the outside of the vacuum casing. The second intermediate conduit portion comprises the part of the intermediate conduits that extends between the second attachment member and the access port. The second intermediate conduit portion is flexible and provides vibration/motion decoupling between the vacuum casing and the support casing to minimize or eliminate the transfer of mechanical vibrations to the projection column.

The first flexible intermediate conduit portion, the second intermediate conduit portion and intermediate conduits being fixed by the first and second attachment members at the specific locations within the vacuum chamber result in an effective vibration/motion decoupling between the access port and the connector panel.

In an embodiment, the control panel comprises one or more complementary connectors for receiving connectors at distal ends of conduits connected to a part of the projection column.

This enables the parts of the projection column to be detachably attached to the electronic equipment, be it via the connector panel of the intermediate conduit assembly to achieve the vibration/motion decoupling.

In an embodiment, the intermediate conduits emanate from a rear side of the connector panel and can be guided on the inside of the vacuum chamber via a predominantly vertical trajectory to a top side of the vacuum chamber.

This enables the intermediate conduits to be guided from within the carrier casing to the outside of the carrier casing without obstructing the projection column within the carrier casing.

In an embodiment, at least one of the first intermediate conduit portion and the second intermediate conduit portion are curved to obtain vibration/motion decoupling in all directions. Typically, a displacement of several micrometers may be attenuated.

In an embodiment, a top side the vacuum chamber comprises a recessed section that comprises an interface wall. The interface wall may comprise the access ports for receiving and passing through the intermediate conduits emanating from the vacuum chamber.

The interface wall is typically provided at a front side of the top side of the vacuum chamber. Alternatively or in addition, the interface wall is provided at a rear side of the top side of the vacuum chamber.

The interface wall enables easy access to the access port for connecting or disconnecting conduits of the electronic equipment. The interface wall is preferably recessed to provide for space in front of the interface wall for external equipment such as a wafer transport system.

In an embodiment, the interface wall extends over an entire width of the top side and lies along a perpendicular direction (i.e. Z-direction) while facing a longitudinal direction (i.e. X-direction).

A multitude of target processing units may be arranged side-to-side in an abutting manner to form e.g. a lithography unit cluster. By extending the interface wall over the entire width, the space in front of the interface wall is continuous over all target processing machines. This enables external equipment, such as a wafer transport system, to use the recessed area without obstruction.

In an embodiment, the electronic equipment is connectable to the access port via one or more detachable cabinet conduits.

This enables the electronic equipment to be detachably connected to the access port, enabling easy replacement of the electronic equipment.

In an embodiment, the target processing unit further comprises a first cable guiding casing along an outer lateral side of the cabinet and a second cable guiding casing along an outer lateral side of the vacuum chamber. The first and second cable guiding casings together can form a cable casing for guiding further conduits from the electronic equipment to further equipment. The further equipment can be located inside the vacuum chamber, below the vacuum chamber or external to the target processing unit.

The further equipment may be equipment, a device, or a component that is less critical to external mechanical vibrations and which may be connected to the electronic equipment or any other equipment in the cabinet without vibration/motion decoupling. As a result, the further conduits may be guided through the cable guiding casings without vibration decoupling.

By implementing the cable guiding casings at the outer side of the target processing unit, the further conduits are easily accessible for installation and servicing. Furthermore, the further conduits can be installed space efficiently. The intermediate conduit assembly and the cable guiding casing yield an arrangement of distinctly grouped conduit paths that supports the modular design of the processing unit. The separate conduit paths formed by the intermediate conduit assembly and the cable guiding casing can be used to separately route conduits for modules and devices that belong to the projection optics column, and conduits for modules/devices that do not. The cable guiding casing allows re-routing of conduits outside of the vacuum space in which the projection optics column resides, so that non-column related conduits are kept out of this vacuum space, and corresponding negative effects (e.g. obstruction, vibration, outgassing) from such a presence may be reduced or even prevented.

In an embodiment, each of the first cable guiding casing and the second cable guiding casing comprises one or more cable gutters. Floor conduit apertures of the cable gutters of the cabinet can be in an aligned orientation with top conduit apertures of the cable gutters of the vacuum chamber when the cabinet is positioned on top of the vacuum chamber.

By guiding the further conduits through cable gutters, the further conduits may be kept spatially separated and electromagnetically shielded from the contents of the cabinet and the vacuum chamber.

The cable gutters of the cabinet are typically positioned such that, when the cabinet is installed on top op the vacuum chamber, the cable gutters are aligned with the cable gutters of the vacuum chamber. This ensures that the further conduits can be easily installed along the edge of the target processing unit.

According to one aspect, there is provided a vacuum chamber for use in a target processing unit having one or more of the above described features. The vacuum chamber can comprise an access port for detachably connecting electronic equipment and a connector panel for detachably connecting one or more parts of a projection column. The access port can be at least partly located outside of the vacuum chamber. The connector panel can be located inside of the vacuum chamber. The access port and the connector panel can be vibration/motion decoupled connected via one or more intermediate conduits.

In an embodiment, the vacuum chamber is arranged for accommodating the projection column. The projection column can be arranged for generating, shaping, and directing a beam toward a target. The one or more parts of the projection column, such as a projection lens assembly, can be communicatively connectable to the external electronic equipment via one or more conduits. The vacuum chamber may comprise a vacuum casing arranged for providing a vacuum environment within the vacuum chamber. The vacuum chamber may further comprise a support casing within the vacuum casing arranged for supporting a carrier casing. The vacuum chamber may further comprise the carrier casing within the support casing arranged for supporting the projection column. The vacuum chamber can further comprise an intermediate conduit assembly at least partly comprising the one or more conduits. The intermediate conduit assembly can comprises the connector panel attached to an inner side of the carrier casing. The intermediate conduit assembly may further comprise a second attachment member connected to an outer side of the carrier casing. The intermediate conduit assembly may further comprise the one or more intermediate conduits emanating from the connector panel and guided to the second attachment member. The intermediate conduit assembly can further comprise a first attachment member attached to an inner side of the support casing. A first flexible intermediate conduit portion of the one or more intermediate conduits can extend between the first attachment member and the second attachment member. The intermediate conduit assembly can further comprise the access port attached to an outer side of the vacuum casing. A second flexible intermediate conduit portion of the one or more intermediate conduits can extend between the first attachment member and the access port.

In an embodiment, the vacuum chamber comprises a first cable guiding casing along an outer lateral side of the cabinet for guiding further conduits from the electronic equipment to further equipment located inside the vacuum chamber, below the vacuum chamber or external to the target processing unit.

The effects and advantages described above with respect to the target processing device apply, mutatis mutandis, to the vacuum chamber.

According to another aspect, there is provided an intermediate conduit assembly for use in a vacuum chamber having one or more of the above described features. The intermediate conduit assembly can comprise an access port for detachably connecting electronic equipment and a connector panel for detachably connecting one or more parts of a projection column. The access port can be arranged to be at least partly located outside of a vacuum chamber. The connector panel can be arranged to be located inside of the vacuum chamber. The access port and the connector panel can be arranged to be vibration/motion decoupled connected via one or more intermediate conduits when installed in the vacuum chamber.

In an embodiment, the projection column is arranged for generating, shaping, and directing a beam toward a target. The one or more parts of the projection column, such as a projection lens assembly, can be communicatively connectable to the external electronic equipment via one or more conduits. The vacuum chamber can comprise a vacuum casing arranged for providing a vacuum environment within the vacuum chamber. The vacuum chamber can further comprise a support casing within the vacuum casing arranged for supporting a carrier casing. The vacuum chamber can further comprise the carrier casing within the support casing arranged for supporting the projection column. The intermediate conduit assembly can at least partly comprise the one or more conduits. The intermediate conduit assembly can further comprise the connector panel arranged to be attached to an inner side of the carrier casing. The intermediate conduit assembly can further comprise a second attachment member arranged to be connected to an outer side of the carrier casing. The intermediate conduit assembly can further comprise the one or more intermediate conduits arranged to emanate from the connector panel and to be guided to the second attachment member. The intermediate conduit assembly can further comprise a first attachment member arranged to be attached to an inner side of the support casing. A first flexible intermediate conduit portion of the one or more intermediate conduits can be arranged to extend between the first attachment member and the second attachment member. The intermediate conduit assembly may further comprise the access port arranged to be attached to an outer side of the vacuum casing. A second flexible intermediate conduit portion of the one or more intermediate conduits can be arranged to extend between the first attachment member and the access port.

Exemplary embodiments of the intermediate conduit assembly and of further conduit guiding arrangements are described herein below. These embodiments may be combined with or incorporated into any of the embodiments of the target processing unit (possibly including any variant of the projection lens assemblies) that have been described herein above.

Intermediate Conduit Assembly

Figure 6:
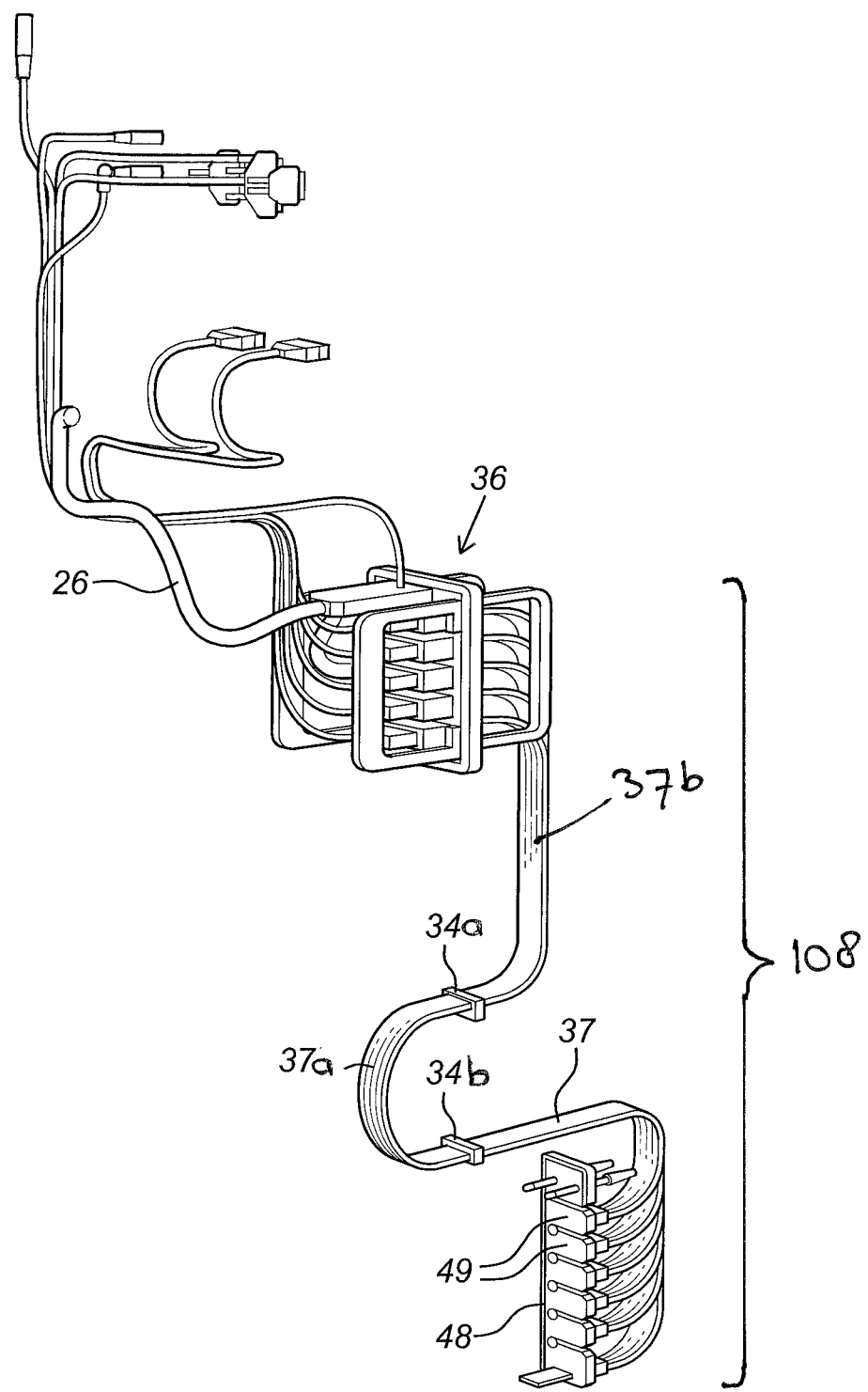
FIG. 6 shows a perspective view of an intermediate conduit assembly provided in an embodiment of a target processing unit similar to the embodiment shown in FIG. 1.

FIG. 6 shows a perspective view of an embodiment of an intermediate conduit assembly 108 comprising intermediate conduits 37. The intermediate conduits 37 comprise a flexible and curved first intermediate portion 37a between the support casing 40 and the carrier casing 41 (similar to FIGS. 1 and 2a), and a flexible and curved second intermediate portion 37b between the support casing 40 and the vacuum casing 39 (similar to FIGS. 1 and 2a). The first intermediate conduit portion 37a extends between two attachment members 34a, 34b. The second intermediate conduit portion 37b extends between first attachment member 34a and access ports 36. The first attachment member 34a fixes the intermediate conduits 37 to the support casing 40, the second attachment member 34b fixes the intermediate conduits 37 to the carrier casing 41, and the access port 36 fixes the intermediate conduits 37 to the vacuum casing 39.

The intermediate conduit assembly 108 allows sufficient vibration/motion decoupling between the vacuum casing 39, the support casing 40, and the carrier casing 41, to reduce or even minimize the transfer of mechanical vibrations from the surroundings (e.g. via cabinet conduits 26, the vacuum casing 39, or the support casing 40) to the projection column 46.

Lateral Conduit Assembly

Figure 7:
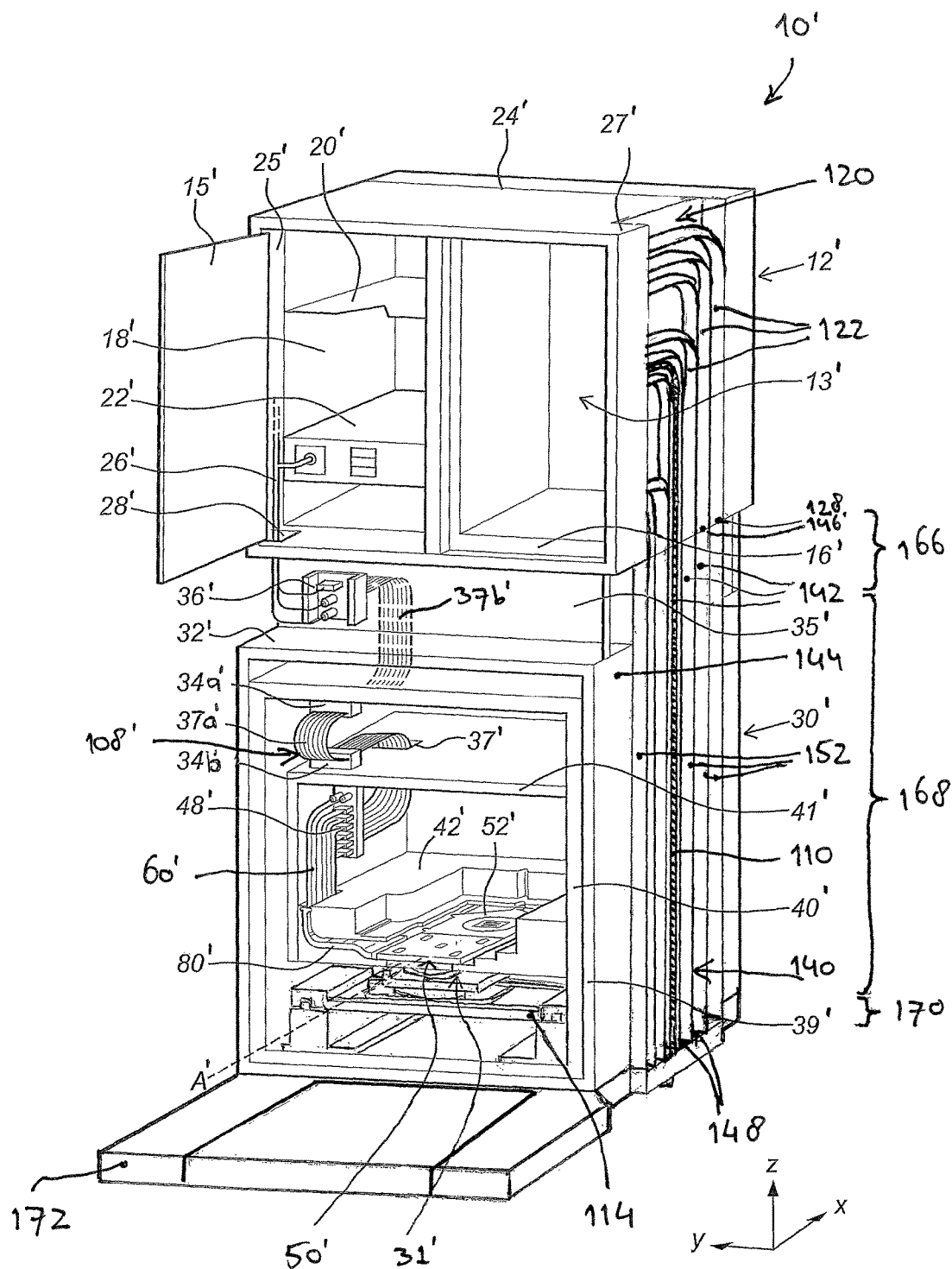
FIG. 7 schematically shows a perspective view of an embodiment of a target processing unit.
Figure 8:
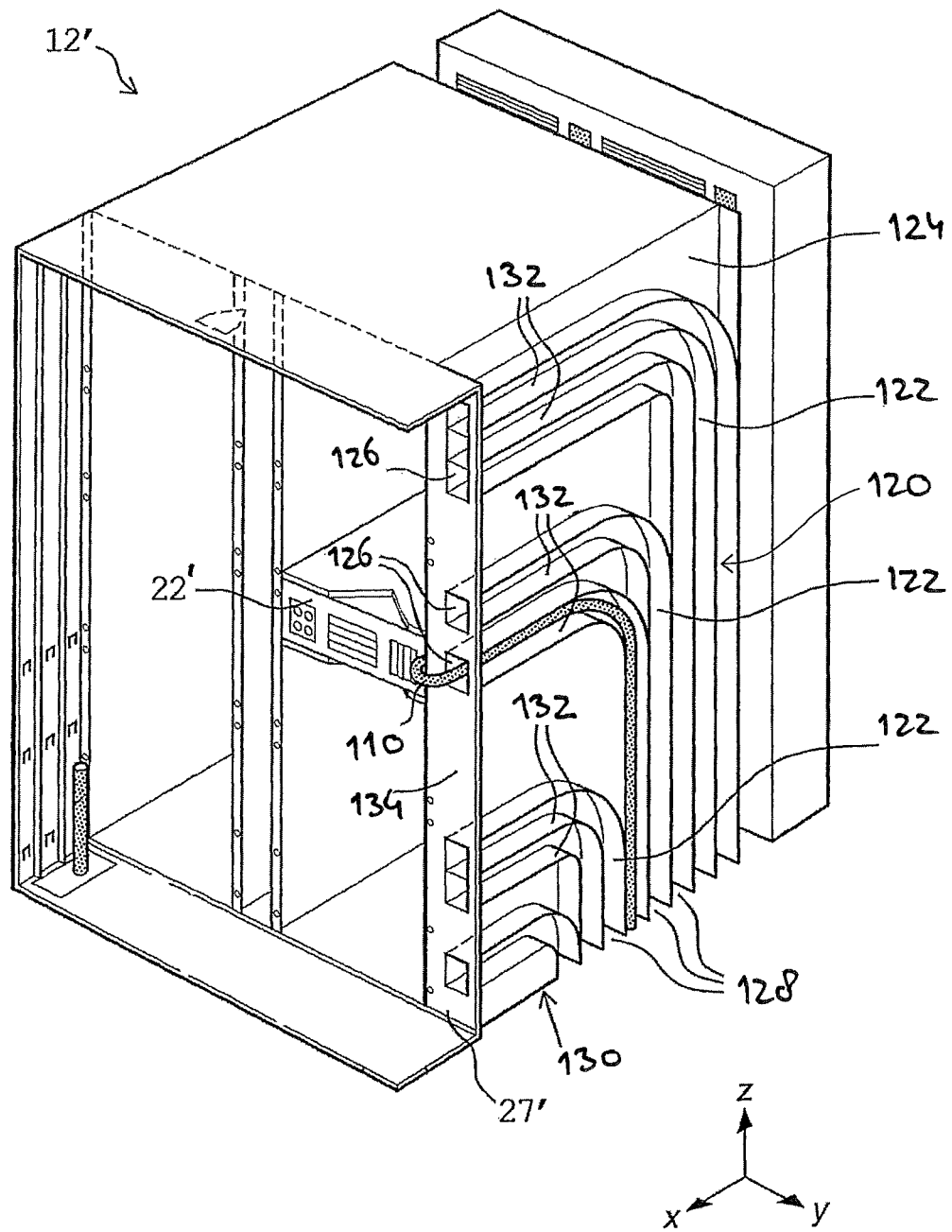
FIG. 8, shows a perspective view of a cabinet of an embodiment of a target processing unit, and FIG. 9 schematically shows a frontal view a vacuum chamber of an embodiment of a target processing unit.
Figure 9:
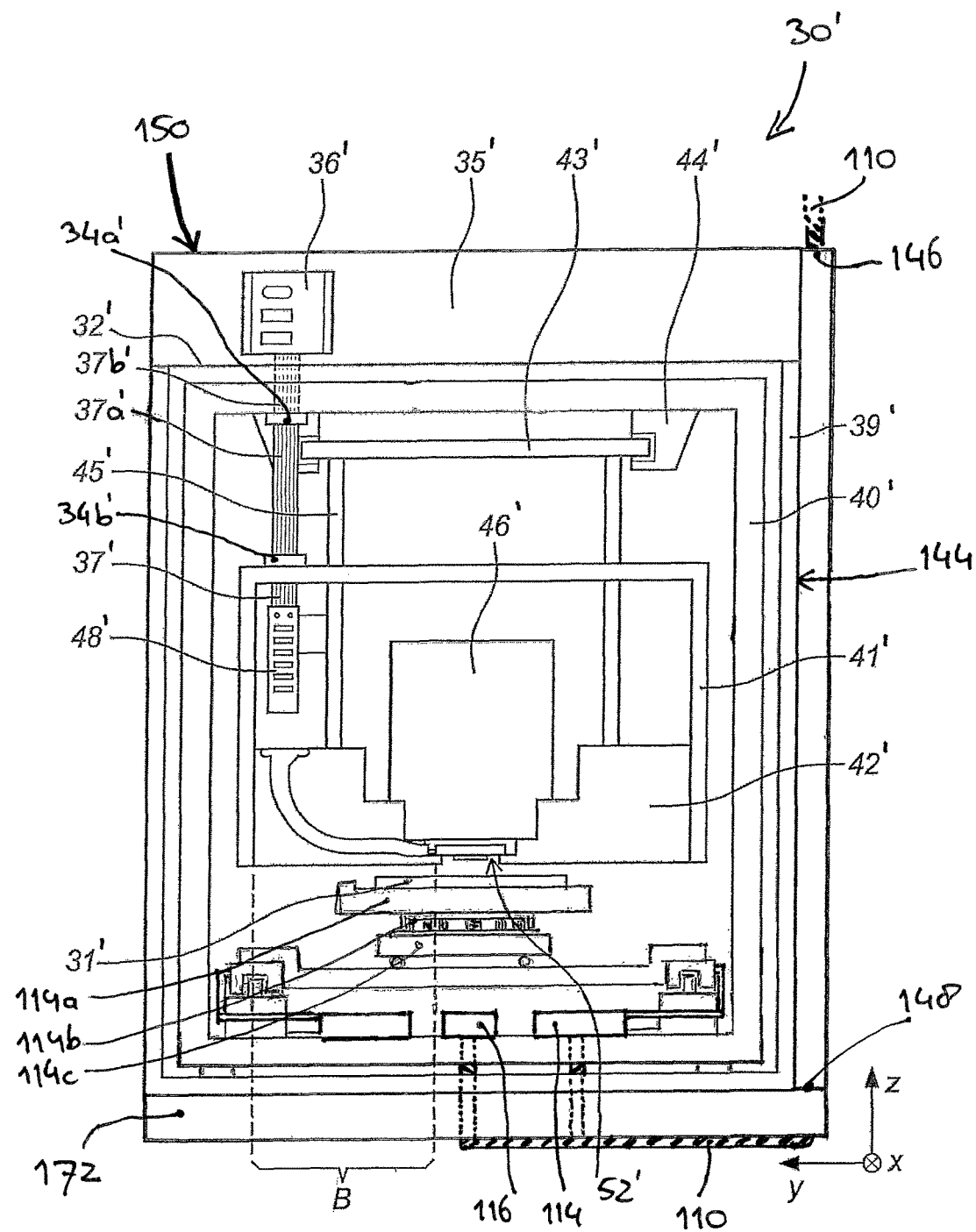

FIGS. 7-9 show an embodiment of a target processing unit provided with a cable distribution arrangement along a lateral side of the target processing unit. Features in the target processing unit that have already been described above with reference to the preceding figures (and in particular FIGS. 1 and 2a) may also be present in the target processing unit 10' shown in FIGS. 7-9, and will not all be discussed here again. For the features that are discussed with reference to FIGS. 7-9, similar reference numbers are used for similar features, but indicated by a prime to distinguish the embodiments.

The cable distribution arrangement serves to guide further conduits 110 from electronic equipment 22' located in the cabinet 12' to further equipment through cable guiding casings 120, 140 comprising cable ducts (e.g. gutters) 122, 142. Alternatively or additionally, the cable distribution arrangement may be used for guiding the further ducts 110 along a lateral side of the target processing unit 10' to equipment below the vacuum chamber 30' or above the cabinet 12', or to other equipment external to the target processing machine 10'.

The vacuum chamber 30' may include various devices and systems that contribute in various ways to the execution, monitoring, and optimization of the lithography process inside the vacuum chamber 30'. Such devices may be electrically coupled via respective further conduits 110 to corresponding equipment 22' inside the cabinet 12'. One exemplary system that may be provided inside the vacuum chamber 30' is a target positioning system 114 for positioning the target 31' below and with respect to the projection column 46'. Another exemplary system is formed by an optical beam sensor 116 that may be mounted at a floor of the support casing 40', and which is configured for determining the locations and/or other properties of beamlets that are generated and projected by the optical column 46'.

As is illustrated in FIG. 7, the target processing unit 10' may be positioned on a base plate 172. This base plate 72 is made of a material with sufficient mechanical strength to support the target processing unit 10' and to keep the unit in a fixed predetermined orientation with respect to surrounding structures. The further conduits 110 may be guided via the second cable ducts 142 provided on the second side wall 144 of the vacuum chamber 30', and further via the base plate 172, along a lower side of the vacuum chamber 30', into the vacuum chamber 30'. Inside the vacuum chamber 30', the further conduits 110 are coupled to the corresponding further equipment, e.g. the target positioning system 114 and the optical beam sensor 116.

FIG. 8 shows a perspective view of an exemplary embodiment of a cabinet 12'. The casing of the cabinet 12' may comprise a vertical recess 27' perpendicular to a side wall 124 of the cabinet 12', arranged for accommodating a portion of the further conduits 110 that are connected to the electronic equipment 22'. In FIG. 8, the vertical recess 27' defines an elongated rectangular cuboid void that vertically extends substantially along the entire first side wall 124 of the cabinet 12'. The vertical recess 27' directs further conduits 110 (only partially shown) towards the cable guiding casings 120, 140, which lead toward the further equipment located inside the vacuum chamber 30'.

The entire first sidewall 124 and the vertical recess 27' may be covered by a side plate (not shown in FIG. 8) to form a first cable guiding casing 120. Alternatively, only first cable ducts 122 may be covered, thereby forming a cable guiding casing with less surface area. In yet another embodiment, the further conduits 110 are guided along the first side wall 124 in sight, e.g. by tie wrapping or otherwise connecting the further conduits to the first sidewall 124. The latter alternative is least preferred as it keeps conduits exposed to potential external damage.

One or more first cable ducts 122 may branch off from the vertical recess 27' at various heights. It is shown in FIG. 8 that the vertical recess 27' is (in part) defined by a vertical recess wall 134 that comprises a plurality of first upper duct apertures 126 provided along the vertical direction Z. The first cable ducts 122 curvedly extend towards first lower duct apertures 128 located at various locations along a longitudinal edge of the floor 130 of the cabinet 12'. This configuration allows desired functional groups or portions of the further conduits 110 to be guided toward predetermined lower locations outside of the cabinet 12', such as into the second cable guiding casing 140 of the vacuum chamber 30'.

Each first cable duct 122 is typically delimited by two elongate first wall members e.g. bent metal strips 132 that are fixed to the first sidewall 124 of the cabinet 12'. The curved ducts 122, which are mounted on an outside of the first sidewall 124, keep the further conduits 110 spatially separated and electromagnetically shielded from the contents of the cabinet 12'. The metal strips 132 may for example be welded in a substantially perpendicular orientation and along a curved trajectory onto an outer surface of the first sidewall 124. Each bent metal strip 132 extends along a respective curved trajectory from a first upper duct aperture 126 to a first lower duct aperture 128. Two adjacent metal strips 132, the first side wall 124 and the side plate (not shown) jointly define one first cable duct 122, which forms a downward curved channel with, in this example, a rectangular cross-section, in which one or more further conduits 110 can be accommodated.

In general, a first wall member 132 may delimit at least one first cable duct 122. In some cases, a single wall member 132 may simultaneously delimit two adjacent first cable ducts 122 on each side thereof. This reduces the amount of wall material required to form adjacent first cable ducts 122. For example, the three upper cable ducts 122 shown in FIG. 8 are bounded by only four metal strips 132 (i.e. two outer metal strips and two intermediate metal strips).

Preferably, as shown in FIG. 8, the curvature of the metal plate trajectory of each first cable duct 122 is smooth (i.e. curvedly bent without folds). A smooth trajectory allows any further conduit 110 to be manually inserted at one duct end (i.e. one of the first apertures 126, 128) and to be gently conveyed through the cable duct 122, and exit at the other duct end (i.e. the corresponding first aperture 128, 126) without obstruction.

In other embodiments, other cable ducts may be alternatively or additionally provided at the opposite first side wall of the cabinet. Such other cable ducts may similarly branch off from this other vertical recess. Furthermore, in any of the cabinet embodiments, at least one of the cable ducts may branch off via a conduit aperture in any vertical recess, to curve into an upward direction toward a top conduit aperture provided along a longitudinal edge of the top wall of the casing. Correspondingly, elongate wall members or metal strips may be welded in a substantially perpendicular orientation along an upward curved trajectory onto the respective sidewall.

FIGS. 7 and 9 show an exemplary embodiment of a vacuum chamber 30'. The vacuum chamber 30' may for example be combined with the cabinet embodiment 12' shown in FIG. 8, to form the target processing unit 10'. In the embodiment of FIGS. 7 and 9, the entire second sidewall 144 of the vacuum chamber 30' is co-planar, and the second cable ducts 142 are mounted on the second sidewall 144 in a laterally outward protruding manner. The second cable ducts 142 may be provided with a cover (not shown), to complete a second cable guiding casing 140.

In the embodiment of FIGS. 7 and 9, each second cable duct 142 is delimited by two elongate second wall members (e.g. metal strips) 152 that are fixed to the side wall of the vacuum chamber 30'. The second cable ducts 142 keep the further conduits 110 spatially separated and electromagnetically shielded from the contents of the vacuum chamber 30'. The metal strips 152 may for example be welded in a substantially perpendicular orientation and along a trajectory onto an outer surface of the second sidewall 144. Each metal strip 152 extends along a respective trajectory from a second upper duct aperture 146, possibly to a second lower duct aperture 148. Two adjacent metal strips 152, the second sidewall 144, and the side plate (not shown) jointly define one second cable duct 142, in which one or more further conduits 110 can be accommodated.

One second wall member 144 may delimit at least one second cable duct 142. In some cases, a single second wall member 152 may simultaneously delimit two adjacent second cable ducts 142 on each side thereof. This reduces the amount of material required to form adjacent second cable ducts 142.

If the equipment cabinet 12' is in an operational position, then the first cable guiding casing 120 and the second cable-guiding casing become aligned to form a vertically oriented cable guiding casing. The resulting arrangement of cable ducts and apertures in FIG. 7 allows desired functional groups of the further conduits 110 to be guided from the equipment cabinet 12', via the first and second cable ducts 122, 142, then via the base plate 172 and sealed base plate ports, towards the inside of the vacuum chamber 30'. The combined lateral cable guiding casing 120, 140 with cable ducts 122, 142 forms a collection of compactly arranged, compartmentalized, and functionally separated paths for the further conduits 110.

A set of clauses is presented directly below, which defines aspects and embodiments of the arrangement of conduits and/or ducts, and which may be subject of one or several divisional applications. These clauses also pertain to alternative embodiments that include elements for which the reference numerals have been indicated with a prime. Only for brevity and clarity, elements marked with a prime have been omitted from the (non-limiting) reference numbers indicated in the clauses below, but should nevertheless be considered inserted wherever applicable.

Clauses c1. A target processing unit (10), comprising:
  an access port (36) for detachably connecting electronic equipment (22) and
  a connector panel (48) for detachably connecting one or more parts (50, 90, 96, 100) of a projection column (46),
wherein the access port (36) is at least partly located outside of the target processing unit (10) and wherein the connector panel (48) is located inside of the target processing unit (10), and wherein the access port (36) and the connector panel (48) are vibration/motion decoupled connected via one or more intermediate conduits (37).

c2. Target processing unit (10) according to clause c1, wherein the intermediate conduits (37) are configured to provide electric and/or optical signal connection between the access port (36) and the connector panel (48) during operation, and wherein the intermediate conduits are provided with a curved flexible intermediate conduit portion (37a, 37b) configured to provide the vibration/motion decoupling between the access port (36) and the connector panel (48).

c3. Target processing unit (10) according to clause c1 or clause c2, comprising:
  a cabinet (12) for accommodating the electronic equipment (22); and
  a vacuum chamber (30) for accommodating the projection column (46),
wherein the projection column (46) is arranged for generating, shaping, and directing a beam toward a target (31), and wherein the one or more parts (50, 90, 96, 100) of the projection column (46), such as a projection lens assembly (50), are communicatively connectable to the electronic equipment (22) via one or more conduits (26, 37, 60),
wherein the vacuum chamber (30) comprises:
  a vacuum casing (39) arranged for providing a vacuum environment within the vacuum chamber (30),
  a support casing (40) within the vacuum casing (39) arranged for supporting a carrier casing, and
  the carrier casing (41) within the support casing (40) arranged for supporting the projection column (46),
the target processing unit (10) further comprising an intermediate conduit assembly (108) at least partly comprising the one or more conduits (26, 37, 60), wherein the intermediate conduit assembly (108) comprises:
  the connector panel (48) attached to an inner side of the carrier casing (41),
  a second attachment member (34b) connected to an outer side of the carrier casing (41), and the one or more intermediate conduits (37) emanating from the connector panel (48) and guided to the second attachment member (34b);
  a first attachment member (34a) attached to an inner side of the support casing (40), wherein a first flexible intermediate conduit portion (37a) of the one or more intermediate conduits (37) extends between the first attachment member (34a) and the second attachment member (34b); and
  the access port (36) provided on an outer side of the vacuum casing (39), wherein a second flexible intermediate conduit portion (37b) of the one or more intermediate conduits (37) extends between the first attachment member (34a) and the access port (36).

c4. Target processing unit (10) according to clause c3, wherein the control panel (48) comprises one or more complementary connectors (49) for receiving connectors (66) at distal ends (65) of conduits (60) connected to a part (50, 90, 96, 100) of the projection column (46).

c5. Target processing unit (10) according to any one of clauses c3-c4, wherein the intermediate conduits (37) emanate from a rear side of the connector panel (48) and are guided on the inside of the vacuum chamber (30) via a predominantly vertical trajectory to a top side (32) of the vacuum chamber (30).

c6. Target processing unit (10) according to any one of clauses c3-c5, wherein at least one of the first intermediate conduit portion (37a) and the second intermediate conduit portion (37b) is curved.

c7. Target processing unit (10) according to any one of the clauses c3-c6, wherein a top side (32) of the vacuum chamber (30) comprises a recessed section (33) that comprises an interface wall (35), wherein the interface wall (35) comprises the access ports (36) for receiving and passing through the intermediate conduits (37) emanating from the vacuum chamber (30).

c8. Target processing unit (10) according to clause c7, wherein the interface wall (35) extends over an entire width of the top side (32) and lies along a perpendicular direction (Z) while facing a longitudinal direction (X).

c9. Target processing unit (10) according to any one of the preceding clauses, wherein the electronic equipment (22) is connectable to the access port (36) via one or more detachable cabinet conduits (26).

c10. Target processing unit (10) according to any one of the preceding clauses, further comprising a first cable guiding casing (120) along an outer lateral side (124) of the cabinet (12) and a second cable guiding casing (140) along an outer lateral side (144) of the vacuum chamber (30), wherein the first and second cable guiding casings (120, 140) together form a cable casing for guiding further conduits (110) from the electronic equipment (22) to further equipment (114, 116) located inside the vacuum chamber (30), below the vacuum chamber (30).

c11. Target processing unit (10) according to clause c10, wherein each of the first cable guiding casing (120) and the second cable guiding casing (140) comprises one or more cable ducts (122, 142), wherein first lower duct apertures (128) of the first cable ducts (122) are in an aligned orientation with second upper duct apertures (146) of the second cable ducts (142) of the vacuum chamber (30) when the cabinet (12) is positioned on top of the vacuum chamber (30).

c12. Vacuum chamber (30) for use in the target processing unit (10) according to any one of clauses c1-c11, comprising an access port (36) for detachably connecting electronic equipment (22) and a connector panel (48) for detachably connecting one or more parts (50, 90, 96, 100) of a projection column (46), wherein the access port (36) is at least partly located outside of the vacuum chamber (30) and the connector panel (48) is located inside of the vacuum chamber (30), and wherein the access port (36) and the connector panel (48) are vibration/motion decoupled connected via one or more intermediate conduits (37).

c13. Vacuum chamber (30) according to clause c12, wherein the intermediate conduits (37) are configured to provide an electric and/or optical signal coupling between the access port (36) and the connector panel (48) during use, and wherein the intermediate conduits are provided with a curved flexible intermediate conduit portion (37a, 37b) configured to provide the vibration/motion decoupling between the access port (36) and the connector panel (48).

c14. Vacuum chamber (30) according to clause c12 or clause c13, arranged for accommodating the projection column (46), wherein the projection column (46) is arranged for generating, shaping, and directing a beam toward a target (31), and wherein the one or more parts (50, 90, 96, 100) of the projection column (46), such as a projection lens assembly (50), are communicatively connectable to the external electronic equipment (22) via one or more conduits (26,37, 60),
wherein the vacuum chamber (30) comprises a vacuum casing (39) arranged for providing a vacuum environment within the vacuum chamber (30), a support casing (40) within the vacuum casing (39) arranged for supporting a carrier casing, and the carrier casing (41) within the support casing (40) arranged for supporting the projection column (46), the vacuum chamber (10) further comprising an intermediate conduit assembly (108) at least partly comprising the one or more conduits (26, 37, 60), wherein the intermediate conduit assembly (108) comprises:

the connector panel (48) attached to an inner side of the carrier casing (41), a second attachment member (34b) connected to an outer side of the carrier casing (41), and the one or more intermediate conduits (37) emanating from the connector panel (48) and guided to the second attachment member (34b);

a first attachment member (34a) attached to an inner side of the support casing (40), wherein a first flexible intermediate conduit portion (37a) of the one or more intermediate conduits (37) extends between the first attachment member (34a) and the second attachment member (34b); and the access port (36) attached to an outer side of the vacuum casing (39), wherein a second flexible intermediate conduit portion (37b) of the one or more intermediate conduits (37) extends between the first attachment member (34a) and the access port (36).

c15. Vacuum chamber (30) according to any one of clauses c12-c14, further comprising a first cable guiding casing (120) along an outer lateral side (124) of the cabinet (12) for guiding further conduits (110) from the electronic equipment (22) to further equipment (114, 116) located inside the vacuum chamber (30), below the vacuum chamber (30).

c16. Intermediate conduit assembly (108) for use in a vacuum chamber (30) according to any one of clauses c12-c15, comprising an access port (36) for detachably connecting electronic equipment (22) and a connector panel (48) for detachably connecting one or more parts (50, 90, 96, 100) of a projection column (46), wherein the access port (36) is arranged to be at least partly located outside of a vacuum chamber (30) and the connector panel (48) is arranged to be located inside of the vacuum chamber (30), and wherein the access port (36) and the connector panel (48) are arranged to be vibration/motion decoupled connected via one or more intermediate conduits (37) when installed in the vacuum chamber (30).

c17. Intermediate conduit assembly (108) according to clause c16, wherein the projection column (46) is arranged for generating, shaping, and directing a beam toward a target (31), and wherein the one or more parts (50, 90, 96, 100) of the projection column (46), such as a projection lens assembly (50), are communicatively connectable to the external electronic equipment (22) via one or more conduits (26, 37, 60), wherein the vacuum chamber (30) comprises a vacuum casing (39) arranged for providing a vacuum environment within the vacuum chamber (30), a support casing (40) within the vacuum casing (39) arranged for supporting a carrier casing, and the carrier casing (41) within the support casing (40) arranged for supporting the projection column (46), wherein the intermediate conduit assembly (108) at least partly comprises the one or more conduits (26, 37, 60), the intermediate conduit assembly (108) further comprising:

the connector panel (48) arranged to be attached to an inner side of the carrier casing (41), a second attachment member (34b) arranged to be connected to an outer side of the carrier casing (41), and the one or more intermediate conduits (37) arranged to emanate from the connector panel (48) and to be guided to the second attachment member (34b);

a first attachment member (34a) arranged to be attached to an inner side of the support casing (40), wherein a first flexible intermediate conduit portion (37a) of the one or more intermediate conduits (37) is arranged to extend between the first attachment member (34a) and the second attachment member (34b); and the access port (36) arranged to be attached to an outer side of the vacuum casing (39), wherein a second flexible intermediate conduit portion (37b) of the one or more intermediate conduits (37) is arranged to extend between the first attachment member (34a) and the access port (36).

c18. Target processing unit (10) for exposing a target (31) to a beam within a vacuum environment, wherein the target processing unit comprises:
- a vacuum chamber (30) defining an inner space for accommodating the target and a plurality of devices (46, 114) for manipulating the target, wherein the vacuum chamber is configured for maintaining a vacuum within the inner space;
- a cabinet (12) for accommodating equipment (22) for at least one of controlling, powering, and cooling the plurality of devices;
wherein the devices comprise:
- a projection column (46) for generating the beam and projecting the beam towards the target (31) during exposure;
- a positioning system (114) for supporting the target (31);
wherein the positioning system is moveably arranged with respect to the projection column, and wherein the positioning system and the projection column occupy spatially distinct portions of the vacuum chamber;
wherein the target processing unit further comprises:
- a plurality of conduits (26, 37, 60, 110) for connecting the projection column and the positioning system to corresponding equipment (22) inside the cabinet;
- first and second conduit guiding arrangements (108, 120, 140) for routing the corresponding conduits towards and into the spatially distinct portions of the vacuum chamber, so as to form distinct conduit paths that allow the respective conduits to separately connect to the projection column and to the positioning system without mutual obstruction.

c19. Target processing unit (10) according to clause c18, wherein the vacuum chamber (30) comprises a vacuum casing (39) that defines a first wall, and a second wall that is opposite to the first wall, wherein the first wall and second wall jointly border a front chamber side with an opening for inserting and removing the projection column (46) into and from the vacuum chamber;
wherein a first conduit guiding assembly (108) is arranged so as to let corresponding conduits (26, 37, 60) approach and connect to the projection column (46) from the first wall; and wherein a second conduit guiding assembly (120, 140) is arranged so as to let corresponding conduits (110) approach and connect to the positioning system (114) from the second wall.

c20. Target processing unit (10) according to clause c19, wherein the first wall forms an upper side of the vacuum chamber, and wherein the second wall forms a lower side of the vacuum chamber, and wherein the second conduit guiding assembly (120, 140) is provided along a lateral wall (144) of the vacuum chamber extends from the upper side to the lower side thereof.

c21. Target processing unit (10) according to clause c20, wherein the cabinet (12) is located on the upper side of the vacuum chamber (30) and is supported by the first wall (32).

c22. Target processing unit (10) according to any one of clauses c19-c21, comprising:
- a carrier frame (42) provided in the inner space of the vacuum chamber (30) and configured for accommodating and supporting the projection column (46);
- a connector panel (48) provided in the inner space of the vacuum chamber and configured for detachably and selectively connecting conduits (60) from the projection column to the conduits (37, 26) of the first conduit guiding assembly (108).

REFERENCE SIGNS LIST 10 target processing unit (e.g. charged particle lithography unit, inspection unit)
12 cabinet
13 front side
15 cabinet door
16 (frontal) plenum
18 rack
20 shelf
22 electronic equipment
24 cooling frame
25 vertical wall portion
26 cabinet conduit (cable)
27 vertical recess
28 floor aperture
30 vacuum chamber
31 target
32 top side
33 recessed section
34a first conduit attachment member/anchor
34b second conduit attachment member/anchor
35 interface wall
36 access port
37 intermediate conduit
37a first flexible intermediate conduit portion
37b second flexible intermediate conduit portion
38 bearing member (rails)
39 vacuum casing
40 support casing
41 carrier casing
42 carrier frame
43 suspension base
44 suspension member
45 suspension rod
46 projection column
47 beamlet
48 connector panel
49 complementary connector
50 projection lens assembly
52 lens support body (pentagonal support plate)
53 lens cut-out
54 lens element
55 abutment member
56 first lateral edge
57 second lateral edge
58 connection region (rear edge)
59 guiding member (wheel)
60 signal conduit
62 power conduit
64 fluid conduit
65 distal end
66 conduit connector
67 cleaning agent supply tube
68 lens carrier ring (temperature stable)
69 alignment sensor 70 conduit guiding body
72 first guiding portion (lateral guiding portion)
73 quadrilateral support plate
74 first further lateral edge
75 second further lateral edge
76 further guiding member (wheel)
78 second guiding portion (vertical guiding portion)
79 tilted edge
80 (curved) sledge
81 sledge guiding member
82 sledge cut-out
83 further rails
90 illumination optics module
92 charged particle beam source
94 beam collimator array
96 condenser lens module
98 aperture array and condenser lens array
100 beam switching module
102 beamlet blanker array
108 intermediate conduit assembly
110 further conduit
112 further equipment
114 target positioning system
114a chuck
114c short stroke stage
116 optical beam sensor
120 first cable guiding casing
122 first cable duct (e.g. gutter)
124 first side wall
126 first upper duct aperture
128 first lower duct aperture
130 cabinet floor
132 first duct wall member
134 vertical recess wall
140 second cable guiding casing
142 second cable duct (e.g. gutter)
144 second side wall
146 second upper duct aperture
148 second lower duct aperture
150 vacuum chamber top
152 second duct wall member
166 upper chamber region
168 lower chamber region
170 base plate region
172 base plate
X longitudinal direction
Y transversal direction
Z perpendicular direction (vertical direction)
P plane
P1 upper plane
P2 lower plane
B lateral region
h support plate height
The above list also covers related elements from alternative embodiments that have been described herein above and depicted in the accompanying drawings. Only for brevity and clarity, the elements from such embodiments that were marked with a prime have been omitted in the above list.

The invention claimed is:

1. Target processing unit comprising:
    a vacuum chamber for accommodating a target to be processed;
    a projection column within the vacuum chamber for generating a beam and projecting the beam towards the target;
    a positioning system within the vacuum chamber for supporting the target, wherein the positioning system is moveably arranged with respect to the projection column, and wherein the positioning system and the projection column occupy spatially distinct portions of the vacuum chamber;
    a first conduit arrangement for connecting the projection column to corresponding equipment external to the vacuum chamber; and
    a second conduit arrangement distinct from the first conduit arrangement for connecting the positioning system to corresponding equipment external to the vacuum chamber,
    wherein the first conduit arrangement extends through an upper side of the vacuum chamber, wherein the second conduit arrangement extends through a lower side of the vacuum chamber, and wherein the second conduit arrangement is guided along a wall of the vacuum chamber to the lower side of the vacuum chamber.

2. The target processing unit according to claim 1, wherein the vacuum chamber comprises a vacuum casing that defines a first wall, and a second wall that is opposite to the first wall, wherein the first wall and second wall jointly border a front chamber side with an opening for inserting and removing the projection column into and from the vacuum chamber, wherein the first wall forms the upper side of the vacuum chamber, and wherein the second wall forms the lower side of the vacuum chamber.

3. The target processing unit according to claim 1, wherein a second conduit guiding assembly is provided along a lateral wall of the vacuum chamber extending from the upper side to the lower side thereof for guiding the second conduit arrangement.

4. The target processing unit according to claim 1, wherein the first conduit arrangement comprises an access port at least partly located outside of the vacuum chamber for detachably connecting the corresponding equipment and a connector panel located inside of the vacuum chamber for detachably connecting one or more parts of the projection column, and wherein the access port and the connector panel are vibration/motion decoupled connected via one or more intermediate conduits of the first conduit arrangement.

5. The target processing unit according to claim 4, wherein the intermediate conduits are configured to provide electric and/or optical signal connection between the access port and the connector panel during operation, and wherein the intermediate conduits are provided with a curved flexible intermediate conduit portion configured to provide the vibration/motion decoupling between the access port and the connector panel.

6. The target processing unit according to claim 4, wherein the vacuum chamber comprises:
    a vacuum casing arranged for providing a vacuum environment within the vacuum chamber;
    a support casing within the vacuum casing arranged for supporting a carrier casing; and
    the carrier casing within the support casing arranged for supporting the projection column,
    wherein the connector panel is attached to an inner side of the carrier casing,
    wherein a second attachment member is connected to an outer side of the carrier casing, the one or more intermediate conduits emanating from the connector panel and guided to the second attachment member,
    wherein a first attachment member is attached to an inner side of the support casing, wherein a first flexible intermediate conduit portion of the one or more intermediate conduits extends between the first attachment member and the second attachment member, and wherein the access port is provided on an outer side of the vacuum casing, wherein a second flexible intermediate conduit portion of the one or more intermediate conduits extends between the first attachment member and the access port.

7. The target processing unit according to claim 6, wherein the intermediate conduits emanate from a rear side of the connector panel and are guided on the inside of the vacuum chamber via a predominantly vertical trajectory to a top side of the vacuum chamber.

8. The target processing unit according to claim 6, wherein at least one of the first intermediate conduit portion and the second intermediate conduit portion is curved.

9. The target processing unit according to claim 2, further comprising a cabinet for accommodating the equipment, wherein preferably the cabinet is located on the upper side of the vacuum chamber and is supported by the first wall.

10. Intermediate conduit assembly for use as a first conduit arrangement in a target processing unit according to claim 1, comprising an access port for detachably connecting electronic equipment and a connector panel for detachably connecting one or more parts of a projection column, wherein the access port is arranged to be at least partly located outside of a vacuum chamber and the connector panel is arranged to be located inside of the vacuum chamber, and wherein the access port and the connector panel are arranged to be vibration/motion decoupled connected via one or more intermediate conduits when installed in the vacuum chamber.

11. The intermediate conduit assembly according to claim 10, wherein the projection column is arranged for generating, shaping, and directing a beam toward a target, and wherein the one or more parts of the projection column, such as a projection lens assembly, are communicatively connectable to the external electronic equipment via one or more conduits,
  wherein the vacuum chamber comprises a vacuum casing arranged for providing a vacuum environment within the vacuum chamber, a support casing within the vacuum casing arranged for supporting a carrier casing, and the carrier casing within the support casing arranged for supporting the projection column,
  wherein the intermediate conduit assembly at least partly comprises the one or more conduits, the intermediate conduit assembly further comprising:
    the connector panel arranged to be attached to an inner side of the carrier casing, a second attachment member arranged to be connected to an outer side of the carrier casing, and the one or more intermediate conduits arranged to emanate from the connector panel and to be guided to the second attachment member;
    a first attachment member arranged to be attached to an inner side of the support casing, wherein a first flexible intermediate conduit portion of the one or more intermediate conduits is arranged to extend between the first attachment member and the second attachment member; and
    the access port arranged to be attached to an outer side of the vacuum casing, wherein a second flexible intermediate conduit portion of the one or more intermediate conduits is arranged to extend between the first attachment member and the access port.

12. Target processing unit comprising:
  a vacuum chamber for accommodating a target to be processed;
  a vacuum casing arranged for providing a vacuum environment within the vacuum chamber;
  a projection column within the vacuum chamber for generating a beam and projecting the beam towards the target;
  a carrier casing within the vacuum casing arranged for supporting the projection column, wherein at least a part of the projection column is moveably arranged with respect to the carrier casing; and
  a first conduit arrangement for connecting the projection column to corresponding equipment external to the vacuum chamber,
  wherein the first conduit arrangement comprises an access port at least partly located outside of the vacuum chamber for detachably connecting the corresponding equipment and a connector panel located inside of the vacuum chamber for detachably connecting one or more parts of the projection column, and wherein the access port and the connector panel are vibration/motion decoupled connected via one or more intermediate conduits of the first conduit arrangement.

13. The target processing unit according to claim 12, wherein the intermediate conduits are configured to provide electric and/or optical signal connection between the access port and the connector panel during operation, and wherein the intermediate conduits are provided with a curved flexible intermediate conduit portion configured to provide the vibration/motion decoupling between the access port and the connector panel.

14. The target processing unit according to claim 12, wherein the vacuum chamber further comprises a support casing within the vacuum chamber arranged for supporting the carrier casing,
  wherein the connector panel is attached to an inner side of the carrier casing,
  wherein a second attachment member is connected to an outer side of the carrier casing, the one or more intermediate conduits emanating from the connector panel and guided to the second attachment member,
  wherein a first attachment member is attached to an inner side of the support casing, wherein a first flexible intermediate conduit portion of the one or more intermediate conduits extends between the first attachment member and the second attachment member, and
  wherein the access port is provided on an outer side of the vacuum casing, wherein a second flexible intermediate conduit portion of the one or more intermediate conduits extends between the first attachment member and the access port.

15. The target processing unit according to claim 12, wherein the intermediate conduits emanate from a rear side of the connector panel and are guided on the inside of the vacuum chamber via a predominantly vertical trajectory to a top side of the vacuum chamber.

16. The target processing unit according to claim 14, wherein at least one of the first intermediate conduit portion and the second intermediate conduit portion is curved.

17. The target processing unit according to claim 12, wherein the vacuum casing defines a first wall, and a second wall that is opposite to the first wall, wherein the first wall and second wall jointly border a front chamber side with an opening for inserting and removing the projection column into and from the vacuum chamber, wherein the first wall forms the upper side of the vacuum chamber, wherein the second wall forms the lower side of the vacuum chamber, and wherein the first conduit arrangement extends through an upper side of the vacuum chamber.

18. The target processing unit according to claim 17, further comprising a cabinet for accommodating the equipment, wherein preferably the cabinet is located on the upper side of the vacuum chamber and is supported by the first wall.

19. Target processing unit according to claim 12, wherein the control panel comprises one or more complementary connectors for receiving connectors at distal ends of conduits connected to a part of the projection column.

* * * * *